United States Patent
Hwang et al.

(10) Patent No.: US 10,885,244 B2
(45) Date of Patent: *Jan. 5, 2021

(54) TEST PATTERN, TEST METHOD FOR SEMICONDUCTOR DEVICE, AND COMPUTER-IMPLEMENTED METHOD FOR DESIGNING INTEGRATED CIRCUIT LAYOUT

(71) Applicant: SAMSUNG ELECTRONICS CO., LTD., Suwon-si (KR)

(72) Inventors: Sung-Wook Hwang, Chilgok-Gun (KR); Jong-Hyun Lee, Suwon-si (KR); Min-Soo Kang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/739,624

(22) Filed: Jan. 10, 2020

(65) Prior Publication Data

US 2020/0151377 A1 May 14, 2020

Related U.S. Application Data

(63) Continuation of application No. 15/259,673, filed on Sep. 8, 2016, now Pat. No. 10,572,616.

(30) Foreign Application Priority Data

Dec. 9, 2015 (KR) .................. 10-2015-0175353

(51) Int. Cl.
*G06F 30/30* (2020.01)
*H01L 21/66* (2006.01)

(52) U.S. Cl.
CPC .............. *G06F 30/30* (2020.01); *H01L 22/20* (2013.01); *H01L 22/34* (2013.01)

(58) Field of Classification Search
CPC ....... G06F 30/30; G06F 30/398; H01L 22/34; H01L 22/20; H01L 23/544; H01L 2223/5442

(Continued)

(56) References Cited

U.S. PATENT DOCUMENTS 4,855,253 A * 8/1989 Weber ................ G01R 31/2884
438/18
6,787,800 B2 9/2004 Weiland et al.
(Continued)

FOREIGN PATENT DOCUMENTS

| JP | 2006337376 | 12/2006 |
| JP | 2015023132 | 2/2015 |
| KR | 1020130053514 | 5/2013 |

*Primary Examiner* — Jack Chiang
*Assistant Examiner* — Brandon Bowers
(74) *Attorney, Agent, or Firm* — Volentine, Whitt & Francos, PLLC

(57) ABSTRACT

A test pattern includes first line patterns disposed at a first level, having discontinuous regions spaced apart by a first space, having a first width, and extending in a first direction. The test pattern includes a connection line pattern disposed at a second level and extending in the first direction, second line patterns disposed at the second level, branching from the connection line pattern, having a second width, and extending in a second direction perpendicular to the first direction. The test pattern includes via patterns disposed at a third level, having a third width, and formed around an intersection region having the first width of the first line pattern and the second width of the second line pattern. First pads are connected with the first line patterns. A second pad is connected with the connection line pattern.

15 Claims, 19 Drawing Sheets

(58) Field of Classification Search
USPC .......................................................... 716/112
See application file for complete search history.

(56) References Cited

U.S. PATENT DOCUMENTS

| | | | |
|---|---|---|---|
| 6,967,110 | B2 | 11/2005 | Guldi et al. |
| 7,395,518 | B2 | 7/2008 | Ciplickas et al. |
| 2006/0195722 | A1 | 8/2006 | Nakayama |
| 2007/0210306 | A1* | 9/2007 | Molinelli Acocella ...................... H01L 22/34 257/48 |
| 2012/0212245 | A1* | 8/2012 | Pinto .................. G01R 31/1263 324/750.3 |
| 2013/0119554 | A1 | 5/2013 | Lee |
| 2014/0253137 | A1 | 9/2014 | Chuang et al. |

* cited by examiner

TEST PATTERN, TEST METHOD FOR SEMICONDUCTOR DEVICE, AND COMPUTER-IMPLEMENTED METHOD FOR DESIGNING INTEGRATED CIRCUIT LAYOUT

CROSS-REFERENCE TO RELATED APPLICATION

This is a Continuation of U.S. application Ser. No. 15/259,673, filed Sep. 8, 2016, now U.S. Pat. No. 10,572,616, issued Feb. 25, 2020, and a claim of priority under 35 U.S.C. § 119 is made Korean Patent Application No. 10-2015-0175353, filed on Dec. 9, 2015 in the Korean Intellectual Property Office, the disclosure of which is incorporated herein in its entirety by reference.

BACKGROUND

The present disclosure relates to a test pattern, a test method for a semiconductor device, and a computer-implemented method for designing an integrated-circuit layout, and more particularly, to a test method for a semiconductor device having a test pattern.

A semiconductor backend process includes a metal interconnect process and a via process. That is, a via is formed to connect a metal interconnect formed on a lower portion with a metal interconnect to be formed on an upper portion. Since the metal interconnect process and the via process may have various problems such as errors in design and errors in processing, metal interconnects are short-circuited or disconnected from one another, or a lower metal interconnect may be incorrectly connected with an upper metal interconnect. These failures reduce a semiconductor manufacturing yield rate and increase a manufacturing cost.

SUMMARY

The present disclosure describes a test pattern that may accurately detect a failure in a short time.

The present disclosure also provides a test method for a semiconductor device that may accurately detect a failure in a short time.

The present disclosure also provides a computer-implemented method for designing a layout of an integrated circuit, which may accurately detect a failure in a short time.

The present disclosure is not limited to the above objectives, but other objectives not described herein may be clearly understood by those skilled in the art from descriptions below.

According to an aspect of the present disclosure, a test pattern includes: multiple first line patterns disposed at a first level, having discontinuous regions spaced apart by a first space, having a first width, and extending in a first direction. The test pattern also includes a connection line pattern disposed at a second level and extending in the first direction. Multiple second line patterns are disposed at the second level, branching from the connection line pattern, having a second width, and extending in a second direction perpendicular to the first direction; Multiple via patterns are disposed at a third level, having a third width, and formed around an intersection region having the first width of the first line pattern and the second width of the second line pattern. First pads are connected with the first line patterns; and a second pad is connected with the connection line pattern.

According to another aspect of the present disclosure, the discontinuous regions of the first line patterns may be formed at the same position or at different positions in the second direction at the same first space or at different first spaces.

According to yet another aspect of the present disclosure, the second line patterns may extend to the same length or to different lengths in the second direction.

According to still another aspect of the present disclosure, each of the first line patterns may have an intersection region with at least one second line pattern that is selected among the second line patterns.

According to another aspect of the present disclosure, the intersection region may include an intersection region having a portion of the first width of the first line pattern and a portion of the second width of the second line pattern; and an intersection region having an entirety of the first width of the first line pattern and an entirety of the second width of the second line pattern.

According to yet another aspect of the present disclosure, the connection line pattern may include a first connection line pattern and a second connection line pattern facing each other with the first line patterns interposed therebetween.

According to still another aspect of the present disclosure, the odd-numbered patterns among the first line patterns may form a first group, even-numbered patterns among the first line patterns may form a second group, odd-numbered patterns among the second line patterns may be branching from the first connection line pattern, and even-numbered patterns among the second line patterns may be branching from the second connection line pattern.

According to another aspect of the present disclosure, the via patterns may be formed around a first intersection region having the first width of the first line patterns of the first group and the second width of the second line patterns branching from the first connection line pattern and around a second intersection region having the first width of the first line patterns of the second group and the second width of the second line patterns branching from the second connection line pattern.

According to yet another aspect of the present disclosure, each of the via patterns may have a center that is vertically matched to or horizontally separated by from a center of the first intersection region or a center of the second intersection region in order to at least partially overlap the first intersection region or the second intersection region.

According to still another aspect of the present disclosure, the first width, the second width, and the third width may have disparate values.

According to another aspect of the present disclosure, a test pattern includes multiple first line patterns disposed at a first level, having discontinuous regions spaced apart by a first space, having a first width, and extending in a first direction. The test pattern also includes multiple second line patterns disposed at a second level, having a length greater than a length of the first space to include the discontinuous regions, having a second width, and extending in the first direction; Multiple via patterns are formed at a third level, having a third width, and formed around an overlap region between the first line patterns and the second line patterns. First pads are connected with the first line patterns.

According to yet another aspect of the present disclosure, the discontinuous regions of the first line patterns may be formed at the same position or at different positions in a second direction perpendicular to the first direction at the same first space or at different first spaces.

According to still another aspect of the present disclosure, the test pattern may further include: a first region in which the first line pattern and the second line pattern overlap at one end, and a second region in which the first line pattern and the second line pattern overlap at the other end.

According to another aspect of the present disclosure, each of the via patterns may have a center that is vertically matched to or horizontally separated by different distances from a center of the first region or a center of the second region in order to at least partially overlap the first region or the second region.

According to yet another aspect of the present disclosure, the first width, the second width, and the third width may have different values.

According to another aspect of the present disclosure, a test method for a semiconductor device includes preparing a substrate including a device region and a test region; and forming multiple first metal interconnects with a first width in a first interconnect layer of the test region. The first metal interconnects extend in a first direction and have discontinuous regions spaced apart by a first space. The test method also includes forming a metal connection line in a second interconnect layer of the test region. The metal connection line extends in the first direction. The test method includes forming multiple second metal interconnects with a second width in the second interconnect layer of the test region. The second metal interconnects extend in a second direction perpendicular to the first direction and branch from the metal connection line. The test method includes forming multiple via structures with a third width in a first via layer of the test region around an intersection region having the first width of the first metal interconnect and the second width of the second metal interconnect. The via structures extend in a third direction perpendicular to the first direction and the second direction. The test method includes forming first pads electrically connected with the first metal interconnects and a second pad electrically connected with the metal connection line. An electric signal is provided to the second pad and one of the first pads. The test method includes examining failures of the first metal interconnects, the second metal interconnects, and the via structures using the electric signal.

According to still another aspect of the present disclosure, in the forming of the first metal interconnects, the discontinuous regions may be formed at the same position or at different positions in the second direction at the same first space or at different first spaces.

According to another aspect of the present disclosure, in the forming of the second metal interconnects, the second metal interconnects may extend to the same length or to different lengths in the second direction.

According to yet another aspect of the present disclosure, in the forming of the second metal interconnects, each of the first metal interconnects may have an intersection region with at least one second line pattern selected among the second metal interconnects.

According to still another aspect of the present disclosure, the intersection region may include an intersection region having a portion of the first width of the first metal pattern and a portion of the second width of the second metal pattern; and an intersection region having an entirety of the first width of the first metal pattern and an entirety of the second width of the second metal pattern.

According to another aspect of the present disclosure, in the forming of the metal connection line, the metal connection line may include a first metal connection line and a second metal connection line facing each other with the first metal interconnects interposed therebetween.

According to yet another aspect of the present disclosure, odd-numbered interconnects among the first metal interconnects may form a first group, even-numbered interconnects among the first metal interconnects may form a second group, odd-numbered interconnects among the second metal interconnects may be branching from the first metal connection line, and even-numbered interconnects among the second metal interconnects may be branching from the second metal connection line.

According to still another aspect of the present disclosure, in the forming of the via structures, the via structures may be formed around a first intersection region having the first width of the first metal interconnects of the first group and the second width of the second metal interconnects branching from the first metal connection line and around a second intersection region having the first width of the first metal interconnects of the second group and the second width of the second metal interconnects branching from the second metal connection line.

According to another aspect of the present disclosure, in the forming of the via patterns, each of the via structures may be formed to have a center that is vertically matched to or horizontally separated from a center of the first intersection region or a center of the second intersection region in order to at least partially overlap the first intersection region or the second intersection region.

According to yet another aspect of the present disclosure, the first via layer may be formed on the first interconnect layer, and the second interconnect layer may be formed on the first via layer.

According to another aspect of the present disclosure, a test method for a semiconductor device includes preparing a substrate including a device region and a test region; and forming multiple first metal interconnects with a first width in a first interconnect layer of the test region. The first metal interconnects extend in a first direction and have discontinuous regions spaced apart by a first space. The test method includes forming multiple second metal interconnects with a second width in a second interconnect layer of the test region. The second metal interconnects extend in the first direction and have a length greater than a length of the first space to include the discontinuous regions The test method includes forming multiple via structures with a third width in a first via layer of the test region around an overlap region between the first metal interconnects and the second metal interconnects; forming first pads electrically connected with the first metal interconnects at both ends; providing an electric signal to the first pads; and examining failures of the first metal interconnects, the second metal interconnects, and the via structures using the electric signal.

According to yet another aspect of the present disclosure, in the forming of the first metal interconnects, the discontinuous regions may be formed at the same position or at different positions in a second direction perpendicular to the first direction at the same first space or at different first spaces.

According to still another aspect of the present disclosure, the forming of the second metal interconnects may include forming a first region in which the first metal interconnect and the second metal interconnect overlap at one end, and a second region in which the first metal interconnect and the second metal interconnect overlap at the other end.

According to another aspect of the present disclosure, in the forming of the via patterns, each of the via structures may have a center that is vertically matched to or horizontally separated from a center of the first region or a center of the second region in order to at least partially overlap the first region or the second region.

According to yet another aspect of the present disclosure, the first via layer may be formed on the first interconnect layer, and the second interconnect layer may be formed on the first via layer.

According to another aspect of the present disclosure, a computer-implemented method for designing an integrated-circuit layout including multiple patterns includes generating first layout data including the patterns; generating feedback data including failure information of elements corresponding to the patterns from a semiconductor device manufactured based on the first layout data; and changing the first layout data to second layout data based on the feedback data. The patterns may include multiple first line patterns disposed at a first level, having discontinuous regions spaced apart by a first space, having a first width, and extending in a first direction; a connection line pattern disposed at a second level and extending in the first direction; multiple second line patterns disposed at the second level, branching from the connection line pattern, having a second width, and extending in a second direction perpendicular to the first direction; and multiple via patterns disposed at a third level, having a third width, and formed around an intersection region having the first width of the first line pattern and the second width of the second line pattern.

The semiconductor device may include: a substrate including a device region and a test region; multiple first metal interconnects corresponding to the first line patterns in a first interconnect layer of the test region; a metal connection line corresponding to the connection line pattern in a second interconnect layer of the test region; multiple second metal interconnects corresponding to the second line patterns in the second interconnect layer of the test region; multiple via structures corresponding to the via patterns in a first via layer of the test region; and first pads electrically connected with the first metal interconnects and a second pad electrically connected with the metal connection line.

According to another aspect of the present disclosure, the generating of the feedback data may include: providing an electric signal to a first pad and a second pad to be measured, generating the feedback data as normal data when electric current flows between the first pad and the second pad and does not flow between another first pad to which the electric signal was not provided and the second pad, generating the feedback data as short-circuit failure data when electric current flows between the first pad and the second pad and also flows between another first pad to which the electric signal was not provided and the second pad, and generating the feedback data as open-circuit failure data when electric current does not flow between the first pad and the second pad.

According to yet another aspect of the present disclosure, the changing of the first layout data to the second layout data may include changing the patterns corresponding to the short-circuit failure data and the open-circuit failure data to the patterns corresponding to the normal data.

According to still another aspect of the present disclosure, the first width, the second width, and the third width may have different values.

According to another aspect of the present disclosure, a computer-implemented method for designing an integrated-circuit layout including multiple patterns includes generating first layout data including the patterns; generating feedback data including failure information of elements corresponding to the patterns from a semiconductor device manufactured based on the first layout data; and changing the first layout data to second layout data based on the feedback data. The patterns may include multiple first line patterns disposed at a first level, having discontinuous regions spaced apart by a first space, having a first width, and extending in a first direction; multiple second line patterns disposed at a second level, having a length greater than a length of the first space to include the discontinuous regions, having a second width, and extending in the first direction; and multiple via patterns disposed at a third level, having a third width, and formed around an overlap region between the first line patterns and the second line patterns.

According to yet another aspect of the present disclosure, the semiconductor device may include a substrate including a device region and a test region; multiple first metal interconnects corresponding to the first line patterns in a first interconnect layer of the test region; multiple second metal interconnects corresponding to the second line patterns in a second interconnect layer of the test region; multiple via structures corresponding to the via patterns in a first via layer of the test region; and first pads electrically connected with the first metal interconnects at both ends.

According to still another aspect of the present disclosure, the generating of the feedback data may include providing an electric signal to first pads to be measured, generating the feedback data as normal data when electric current flows between the first pads, and generating the feedback data as open-circuit failure data when electric current does not flow between the first pads.

According to another aspect of the present disclosure, the changing of the first layout data to the second layout data may include changing the patterns corresponding to the open-circuit failure data to the patterns corresponding to the normal data.

According to yet another aspect of the present disclosure, the first width, the second width, and the third width may have different values.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
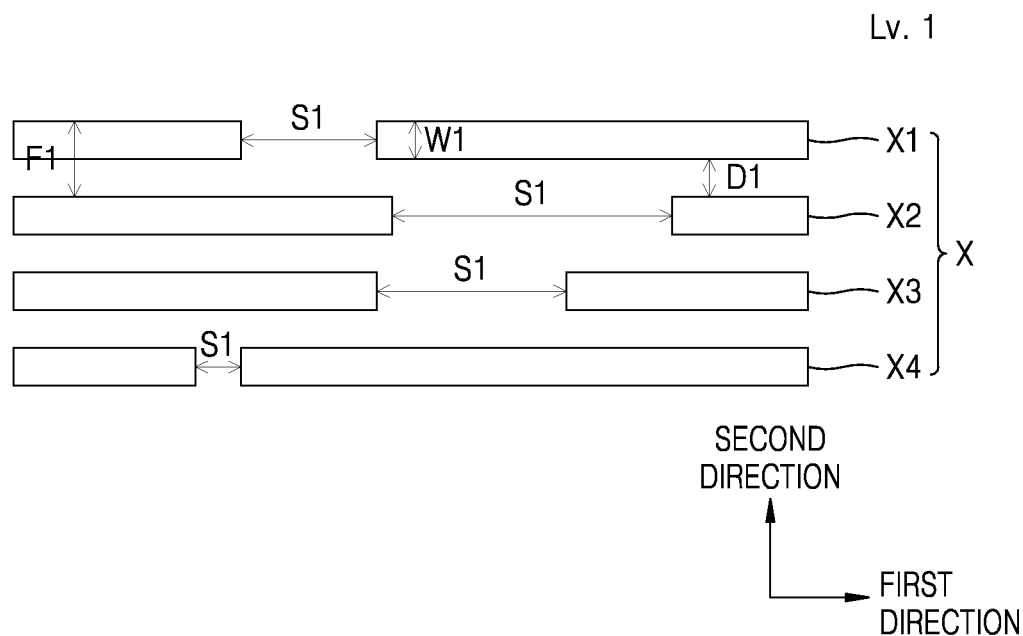
FIG. 1 is a plan view showing a test pattern formed at a first level according to an embodiment of the present disclosure.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

The same reference numerals are used for the same components in the drawings, and a repetitive description thereof will be omitted.

Embodiments of the present disclosure are provided for those skilled in the art to fully understand the teachings of the present disclosure. However, the following embodiments may be embodied in many different forms, and the present disclosure is not limited to the flowing embodiments. Rather, these embodiments are provided so that this disclosure is thorough and complete, and fully conveys the present disclosure to those skilled in the art.

It should be understood that, although the terms first, second, etc. may be used herein to describe various members, regions, layers, portions, and/or elements, these members, regions, layers, portions, and/or elements are not being limited by these terms. These terms do not denote any order, quantity, or importance, but rather are only used to distinguish one member, region, portion, or element from another member, region, portion, or element. Thus, a first member, region, portion, or element discussed below could be termed a second member, region, portion, or element without departing from the teachings of example embodiments. For example, a first element could be termed a second element, and, similarly, a second element could be termed a first element, without departing from the scope of example embodiments.

Unless otherwise defined, all terms (including technical and scientific terms) used herein have the same meaning as commonly understood by one of ordinary skill in the art to which example embodiments belong. It should be further understood that terms, such as those defined in commonly used dictionaries, should be interpreted as having a meaning that is consistent with their meaning in the context of the relevant art and not be interpreted in an idealized or overly formal sense unless expressly so defined herein.

When a certain embodiment may be implemented differently, a specific process order may be performed differently from the described order. For example, two consecutively described processes may be performed at substantially the same time or performed in an order opposite to the described order.

As such, variations from the shapes of the illustrations as a result of, for example, manufacturing techniques and/or tolerances, are to be expected. Thus, example embodiments are not to be construed as limited to the particular shapes of regions illustrated herein but may include deviations in shapes that result, for example, from manufacturing.

As used herein, the term "and/or," includes any and all combinations of one or more of the associated listed items.

A size of a transistor has gradually been decreasing according to the development of a manufacturing process technology of a semiconductor device, and thus a larger number of transistors are integrated in a semiconductor. For example, a system-on-chip, which is an integrated circuit that integrates all components of an electronic system into a single chip, is widely used in various electronic devices. A semiconductor device including a larger number of components is required as the performance of the electronic device is enhanced.

As the size of a transistor integrated into the semiconductor device gradually decreases, the difficulty of a semiconductor device manufacturing process increases. To this end, the importance of a design-for-manufacturing, which considers a semiconductor device manufacturing process when the semiconductor device is designed and which easily uses the semiconductor device manufacturing process, has been increasing along with the advancement in technology for the semiconductor device manufacturing process.

In a semiconductor device manufacturing process, a semiconductor backend process includes a metal wiring process and a via process. That is, a via is formed to connect a metal interconnect formed on a lower portion with a metal interconnect to be formed on an upper portion. As a larger number of transistors are integrated into a semiconductor device, a metal interconnect forming process and a via forming process are becoming more complicated. Moreover, a metal interconnection and a via may be incorrectly connected due to various problems such as a design failure, a manufacturing process error, or the like.

The design rule is consistently decreasing, and the size of vias that connect metal interconnects is also consistently decreasing. In particular, when there is a single via, that is, there is no other via in the vicinity thereof, a process failure such as an open-circuit or a short-circuit may occur due to a manufacturing process variation.

It is not easy to predict and prevent all conditions in which failure may occur in a semiconductor design step. It is even less easy to make a design in consideration of failures that are as yet unknown. In order to check for a failure of a via, a test is conducted using a semiconductor device which is manufactured using a test pattern which is designed in consideration of possible failures predicted as far in advance as possible. Thus, a test pattern in which different vias are formed and disposed to reflect unknown failures in a design and a test method for a semiconductor device manufactured using the test pattern are required.

The present disclosure is intended to provide a test method for a semiconductor device that may easily detect process failures such as an open-circuit or a short-circuit of a metal interconnect and a via, which may occur in an actual semiconductor device manufacturing process, by utilizing a test pattern designed with an algorithm for variably (e.g., arbitrarily, pseudo-randomly) positioning vias in metal interconnects. The algorithm may be stored in a memory and executed using a tangible processor of, e.g., a computer.

Hereinafter, embodiments of the present disclosure will be described in detail with reference to the accompanying drawings.

FIG. 1 is a plan view showing a test pattern formed at a first level according to an embodiment of the present disclosure.

Multiple first line patterns X formed at a first level, extending in a first direction, having discontinuous regions spaced apart by a first space S1, and having a first width W1 are illustrated with reference to FIG. 1.

The first line patterns X may be formed at the first level and in a first color. The color denotes, for example, a color in a design layout of an integrated circuit with a graphic data system II (GDSII) format. Different first line patterns X may have different first widths W1. Additionally, different adjacent first line patterns X may be separated by different first separation distances D1. A first pitch F1, which is a sum of the first width W1 and the first separation distance D1, may be the same for different first line patterns X, so that even when a first width W1 and a first separation distance D1 are not the same for two first line patterns X, the sum of the first pitch F1 is the same for different first line patterns X. The first width W1 denotes a length in a second direction perpendicular to the first direction.

The discontinuous regions of the first line patterns X may be variably formed at the same position or at different positions in the second direction. The discontinuous regions of the first line patterns X may be spaced apart at the same first space S1 or at different first spaces S1. In addition, some of the first line patterns X may not include any discontinuous region or may include two or more discontinuous regions. FIG. 1 illustrates four first line patterns X, i.e., X1, X2, X3, and X4. However, embodiments of the present disclosure are not limited to four first line patterns X.

Figure 2:
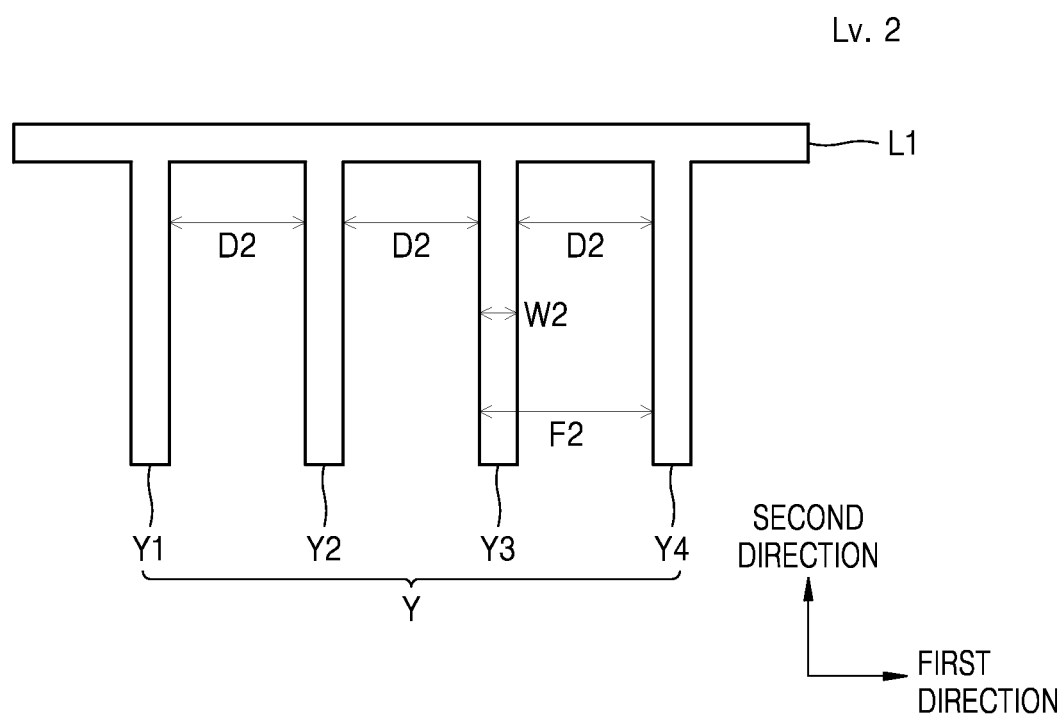
FIG. 2 is a plan view showing a test pattern formed at a second level according to an embodiment of the present disclosure.

FIG. 2 is a plan view showing a test pattern formed at a second level according to an embodiment of the present disclosure.

A connection line pattern L1 formed at the first level and the second level and extending in the first direction, and multiple second line patterns Y formed at the second level, extending in the second direction, branching from the connection line pattern L1, and having a second width W2 are illustrated with reference to FIG. 2.

The connection line pattern L1 and the second line patterns Y may be formed at the second level and in a second color. Different second line patterns Y may have different second widths W2. Additionally, different adjacent second line patterns Y may be separated by different second separation distances D2. A second pitch F2, which is a sum of the second width W2 and the second separation distance D2, may be the same. The second width W2 denotes a length in the first direction.

One end of each of the second line patterns Y may be formed to extend up to the connection line pattern L1. The connection line pattern L1 may be perpendicular to the second line patterns Y. FIG. 2 shows the second line patterns Y having the same length in the second direction. However, in some embodiments, the second line patterns Y may extend to have at least one or more different lengths in the second direction. Each of the second line patterns Y may be branching from the connection line pattern L1 to form the shape of the letter "T" with the connection line pattern L1. FIG. 2 illustrates four second line patterns Y, i.e., Y1, Y2, Y3, and Y4. However, embodiments of the present disclosure are not limited thereto.

Figure 3:
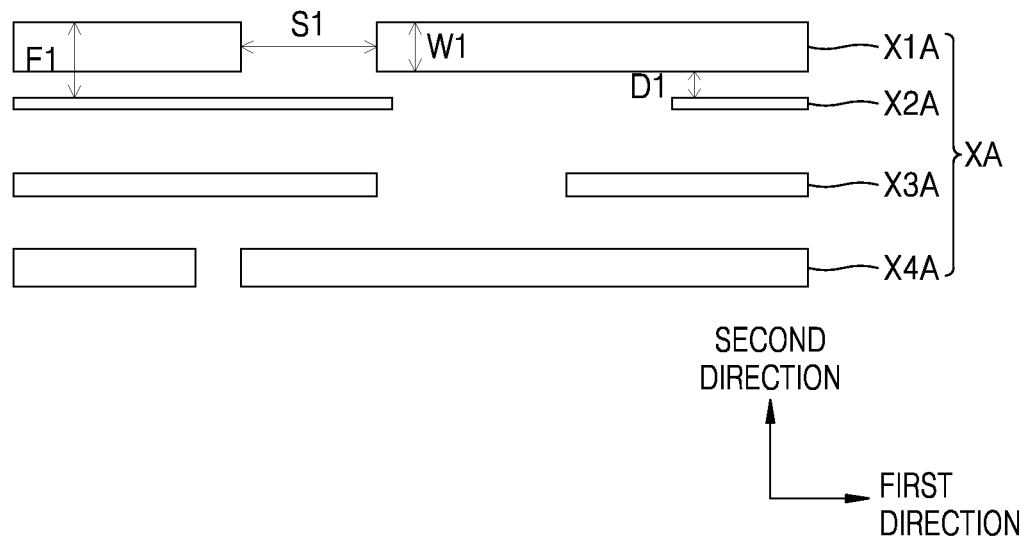
FIG. 3 is a plan view showing a test pattern formed at a first level according to an embodiment of the present disclosure.

FIG. 3 is a plan view showing a test pattern formed at a first level according to an embodiment of the present disclosure.

Multiple first line patterns XA having different first widths W1 and different first separation distances D1 are illustrated with reference to FIG. 3.

Different first line patterns XA may have different first widths W1. Additionally, different adjacent first line patterns XA may be separated by a different first separation distances D1. A first pitch F1, which is a sum of the first width W1 and the first separation distance D1, may be the same for different first line patterns XA, so that even when a first width W1 and a first separation distance D1 are not the same for two first line patterns XA, the sum of the first pitch F1 is the same for different first line patterns XA. That is, the first line patterns XA may have the same first pitch F1, but are not limited thereto.

Figure 4:
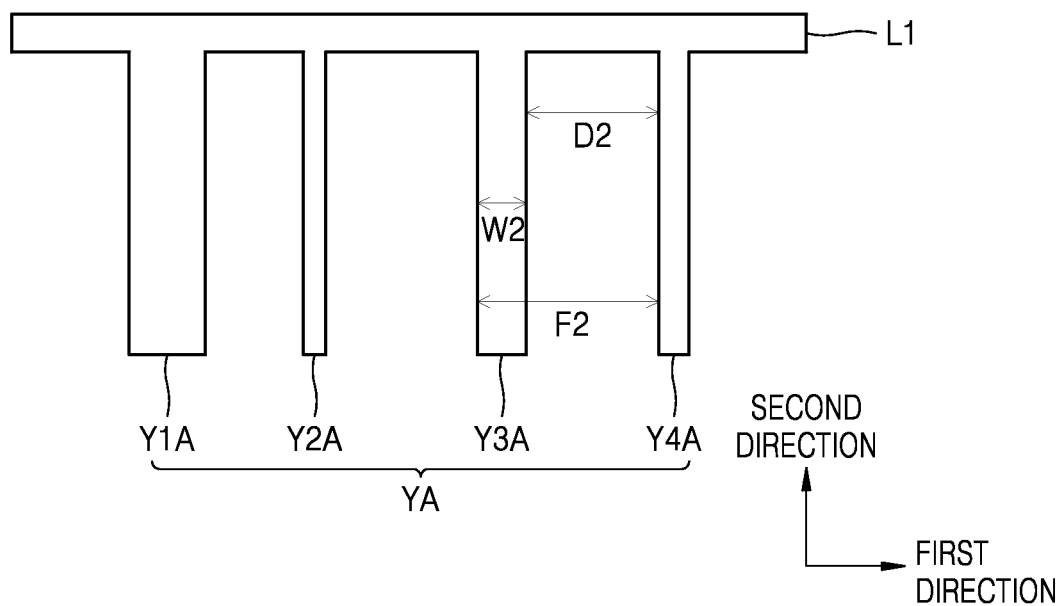
FIG. 4 is a plan view showing a test pattern formed at a second level according to an embodiment of the present disclosure.

FIG. 4 is a plan view showing a test pattern formed at a second level according to an embodiment of the present disclosure.

Multiple second line patterns YA having different second widths W2 and different second separation distances D2 are illustrated with reference to FIG. 4.

Different second line patterns YA may have different second widths W2. Additionally, different adjacent second line patterns YA may be separated by a different second separation distances D2. A second pitch F2, which is a sum of the second width W2 and the second separation distance D2, may be the same. That is, the second line patterns YA may have the same first pitch F1, but are not limited thereto.

Figure 5:
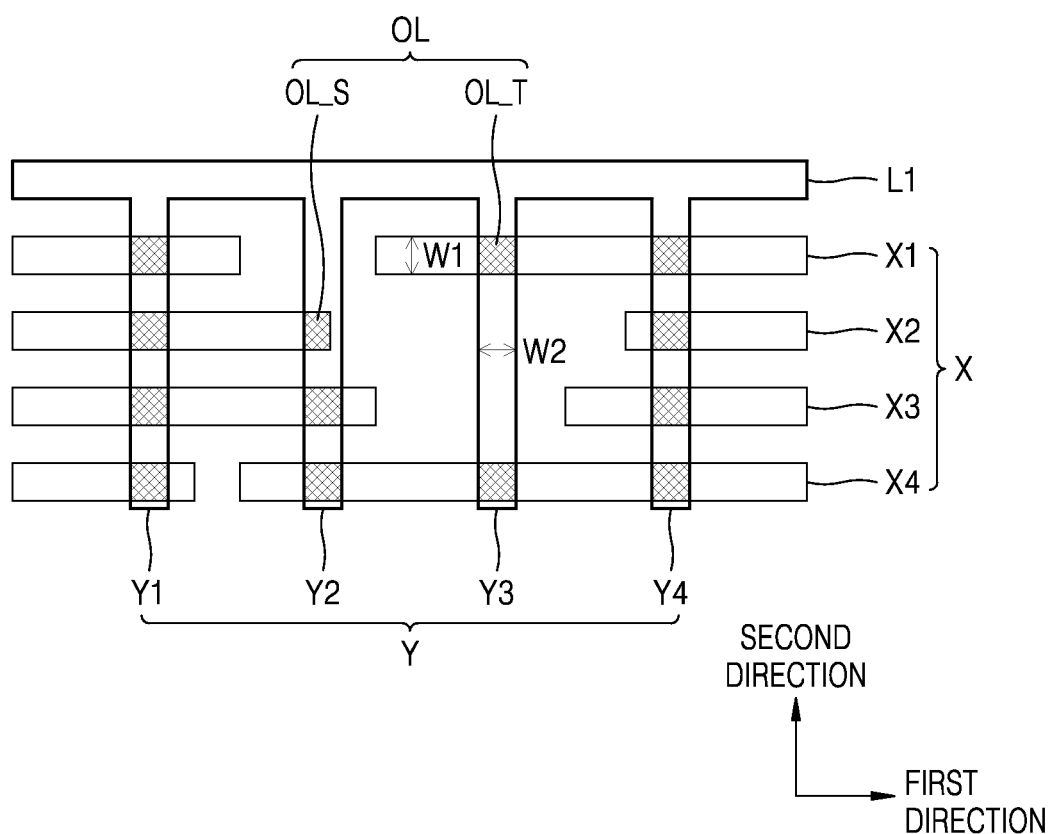
FIG. 5 is a plan view showing test patterns formed at a first level and a second level according to an embodiment of the present disclosure.

FIG. 5 is a plan view showing test patterns formed at a first level and a second level according to an embodiment of the present disclosure.

Intersection regions OL between the first line patterns X formed at the first level and the second line patterns Y formed at the second level are illustrated with reference to FIG. 5.

The following task may be performed in a process of forming the first level and the second level. First, an operation of receiving data input to the first line patterns X and the second line patterns Y may be performed. The input data may include geometric information about patterns of an integrated circuit, such as GDSII. For example, the input data may include arrangement information on multiple patterns formed at one level, and the arrangement information may include information regarding a position, a size, and a connected net of each of the patterns. According to an embodiment of the present disclosure, the input data may include coloring information. The coloring information included in the input data may be defined by default when patterns of the integrated circuit are generated, and may be generated by a coloring algorithm of a semiconductor design tool on the basis of patterns of the integrated circuit. The algorithm may be stored in a memory and executed using a tangible processor of, e.g., a computer.

Next, an operation of checking a design rule may be performed on the patterns. The design rule may include multiple numerical figures that should be met while patterns of an integrated circuit are designed on the basis of a given semiconductor manufacturing process. For example, the design rule may include a minimum width and also a minimum space between two patterns formed at one level. Furthermore, the design rule may include a minimum distance between patterns formed on the basis of the same mask and a minimum distance between patterns formed on the basis of different masks. According to an embodiment of the present disclosure, the patterns may be formed at the same level, and whether the patterns meet the design rule may be determined.

By performing the above-described task, the first line patterns X formed at the first level may intersect the second line patterns Y formed at the second level. According to an embodiment of the present disclosure, any one line pattern X1, X2, X3, or X4 selected among the first line patterns X and any one line pattern Y1, Y2, Y3, or Y4 selected among the second line patterns Y may have at least one intersection region OL formed therebetween. The intersection region OL may include a partial intersection region OL_S, which is an intersection region having a portion of the first width W1 of the first line patterns X1, X2, X3, and X4 and a portion of the second width W2 of the second line patterns Y1, Y2, Y3, and Y4, or a total intersection region OL_T, which is an intersection region having an entirety of the first width W1 of the first line patterns X1, X2, X3, and X4 and an entirety of the second width W2 of the second line patterns Y1, Y2, Y3, and Y4.

Among the first line patterns X, some first line patterns, such as the first line pattern X4, may form intersection regions OL with all of the second line patterns Y, and the other first line patterns, such as the first line patterns X1, X2, and X3, may form intersection regions OL with some of the second line patterns Y. In addition, some first line patterns, such as the first line pattern X2, may be generated to have both of the partial intersection region OL_S and the total intersection region OL_T, and the other first line patterns, such as the first line patterns X1, X3, and X4, may be generated to only have the total intersection region OL_T.

FIG. 5 shows the first line patterns X formed at the first level and the second line patterns Y formed at the second level, which are shown in FIGS. 1 and 2. However, instead of the first line patterns X shown in FIG. 1, the first line patterns XA shown in FIG. 3 may be used, and instead of the second line patterns Y shown in FIG. 2, the second line patterns YA shown in FIG. 4 may be used. Here, the intersection regions OL may have the shape of a rectangle rather than a shape of a square as shown in the drawings. That is, the intersection regions OL may have various shapes.

Figure 6:
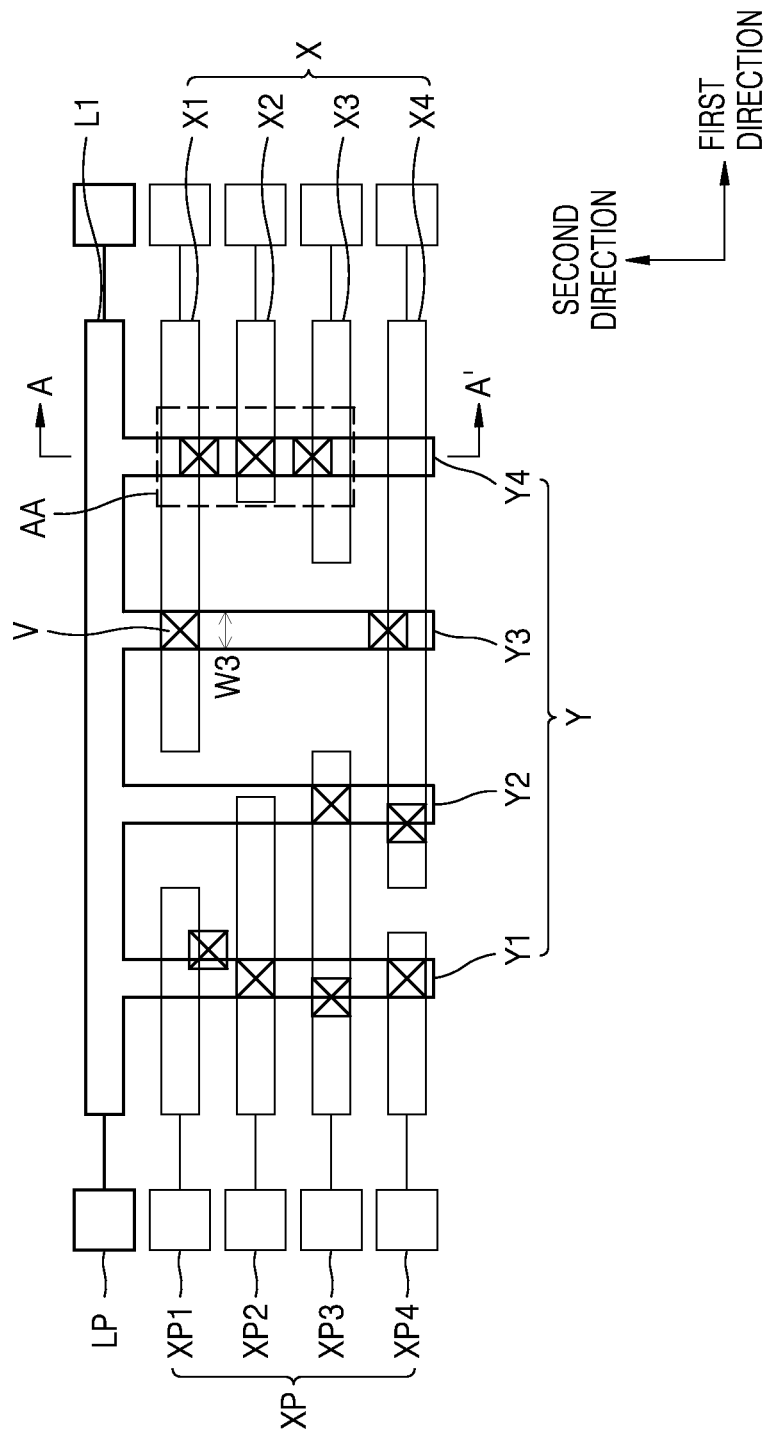
FIG. 6 is a plan view showing test patterns formed at a first level and a second level according to an embodiment of the present disclosure.

FIG. 6 is a plan view showing test patterns formed at a first level and a second level according to an embodiment of the present disclosure.

Multiple via patterns V formed in the total intersection region OL_T (see FIG. 5) among the intersection regions OL (see FIG. 5) are illustrated with reference to FIG. 6.

Because the partial intersection region OL_S (see FIG. 5) among the intersection regions OL (see FIG. 5) may not provide enough of an overlapped area to form the via patterns V, the via patterns V may not be formed. However, embodiments of the present disclosure are not limited thereto.

A center of the total intersection region OL_T (see FIG. 5) and a center of the via pattern V may be vertically matched to or horizontally separated by a variable distance from each other so that the via patterns V at least partially overlap the total intersection region OL_T (see FIG. 5). The via patterns V may be formed at a third level rather than at the first level and the second level and in a third color.

The integrated circuit may be formed as multiple standard cells, and a tool for designing the integrated circuit may use a standard cell library including information regarding the standard cells to design the integrated circuit, that is, to complete patterns of the integrated circuit. The tool for designing the integrated circuit may position the via pattern V at a pin (that is, an input pin or an output pin) included in the standard cell to connect the pin with a pattern and a pin formed at a level different from a level at which the standard cell is formed. That is, an input signal or an output signal of the standard cell may move by positioning the via pattern V at the pin of the standard cell.

In a semiconductor device, multiple via structures 145 (see FIG. 7) may be formed by a via hole formed by the pattern and a via plug filling the via hole. While the patterns of the integrated circuit are designed, the design rule may define a space between the via patterns V. For example, the design rule may include a via-to-via space rule, and the via-to-via space rule may include a minimum space between the via patterns V. The via-to-via space rule may be determined on the basis of a process for forming the via structures 145 (see FIG. 7), for example, a photolithography process and an etching process that are used to form patterns for forming the via structures 145 (see FIG. 7).

As the design rule for the patterns is checked, the design rule for the via patterns V may be checked, and there may be via patterns V that violate the design rule. The via patterns V that violate the design rule may be understood as patterns for forming the via patterns V that violate the design rule. The via patterns V that are colored may be understood as patterns for forming the via patterns V that are colored.

The via patterns V may have at least one different third width W3, and may be variably (e.g., arbitrarily, pseudo-randomly) formed as long as the via patterns V are not in a range that overlaps or is in contact with the other via patterns V formed in the different pluralities of line patterns X and Y.

That is, the via patterns V may be variably positioned in the total intersection region OL_T (see FIG. 5) between the first line patterns X and the second line patterns Y in terms of position, size, or overlapped area as long as the design rule is met.

Figure 7:
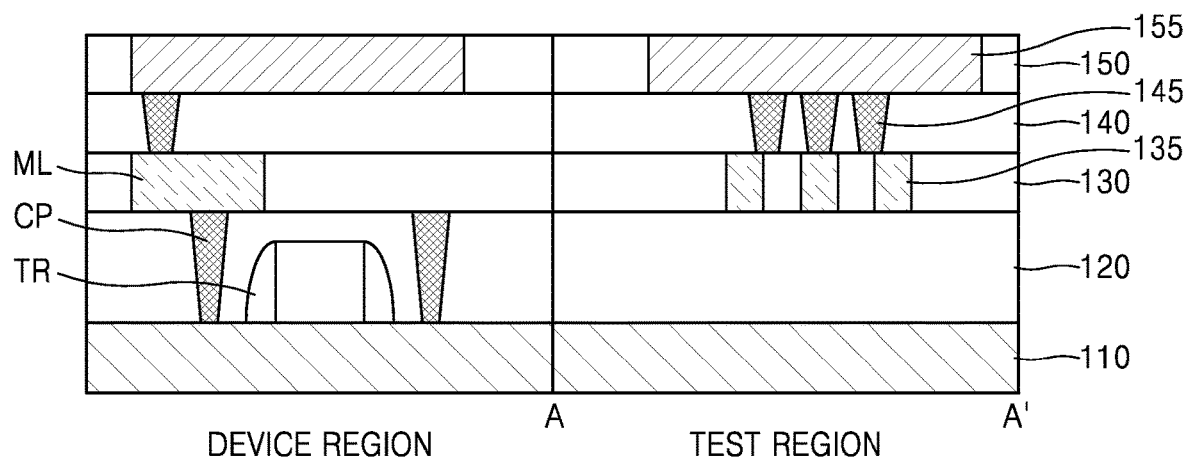
FIG. 7 is a cross sectional view of a semiconductor device that is used in a test method for a semiconductor device according to an embodiment of the present disclosure.
Figure 7:
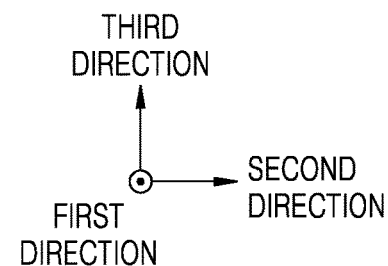

FIG. 7 is a cross sectional view of a semiconductor device that is used in a test method for a semiconductor device according to an embodiment of the present disclosure.

A cross sectional view of the semiconductor device processed with a mask including the test pattern of FIG. 6 taken along line A-A' having, as its center, a part of the semiconductor device corresponding to region AA of FIG. 6 is illustrated with reference to FIGS. 6 and 7.

A process of manufacturing the semiconductor device using the mask including the test pattern of FIG. 6 is as follows. A substrate 110 including a device region and a test region is prepared. An interlayer insulating film 120 is formed on the test region of the substrate 110. A photolithography process and an etching process are performed on a first interconnect layer 130 disposed on the interlayer insulating film 120 in order to form multiple first metal interconnects 135 using the mask including the test pattern of FIG. 6 corresponding to the first line patterns X at a first level of the test pattern. A photolithography process and an etching process are performed on a first via layer 140 of the test region in order to form multiple via structures 145 using the mask including the test pattern of FIG. 6 corresponding to the via patterns V at a third level of the test pattern. A photolithography process and an etching process are performed on a second interconnect layer 150 of the test region in order to form a metal connection line (not shown) and multiple second metal interconnects 155 using the mask including the test pattern of FIG. 6 corresponding to multiple second line patterns Y and a connection line pattern L1 at a second level of the test pattern. The first interconnect layer 130, the second interconnect layer 150, and the first via layer 140 may each include an insulating film.

The device region may include a cell region and a peripheral circuit region. The test region may be a region included in the cell region and the peripheral circuit region or a region on which semiconductor devices and a scribe lane for dividing the semiconductor devices are positioned.

A transistor TR may be formed in the device region, and there may be a contact plug CP and a metal interconnect ML electrically connected with the transistor TR. In addition, the contact plug CP and the metal interconnect ML may be surrounded by an insulating film. In the test region, unlike in the device region, there may not be a transistor TR inside the interlayer insulating film 120 and there may only be the interlayer insulating film 120 on the substrate 110.

The substrate 110 may be made of semiconductor. In some embodiments, the substrate 110 may be made of semiconductor such as silicon or germanium. In some embodiments, the substrate 110 may include compound semiconductor such as silicon germanium, silicon carbide, gallium arsenide, indium arsenide, or indium phosphide. In some embodiments, the substrate 110 may have a silicon-on-insulator (SOI) structure.

The interlayer insulating film 120, an insulating film of the first interconnect layer 130, an insulating film of the second interconnect layer 150, and an insulating film of the first via layer 140 may be made of an insulating material, which includes, but is not limited to, a silicon oxide film, a silicon nitride film, a silicon oxynitride film, a low-k material with a dielectric constant lower than a dialectric constant of a silicon oxide film, or a combination thereof.

The first metal interconnects 135, the metal connection line (not shown), the second metal interconnects 155, and the via structures 145 may be made of a conductive material, which includes, but is not limited to, titanium, titanium nitride, tantalum, tantalum nitride, tungsten, copper, aluminium, a mixture thereof, or a compound thereof.

In region AA of FIG. 6, the via patterns V are formed adjacent to one another. The test pattern is formed to meet the design rule. However, when the test pattern is actually implemented in a semiconductor device, adjacent via structures 145 may induce an open-circuit or short-circuit failure due to limitations in a process, etc. When designed via patterns V are implemented without failures as the via structures 145 in the semiconductor device, a designed space of the via patterns V may actually be implemented in the semiconductor device.

A test method for a semiconductor device may include forming first pads that are electrically connected with the first metal interconnects 135 and each correspond to a first test pad XP connected with a first line pattern X of the test pattern, and a second pad that is electrically connected with the metal connection line (not shown) and corresponds to a second test pad LP connected with a connection line pattern L1 of the test pattern, providing an electric signal to the second pad and one of the first pads, and examining failures of the first metal interconnect 135, the second metal interconnect 155, and the via structure 145 using the electric signal. The first pad and the second pad may be present at the same level.

According to the test method of the semiconductor device according to the present disclosure, the failures may be accurately detected in a short time. That is, when an electric signal is provided to a first pad and a second pad, and electric current flows between the first pad and the second pad while not flowing between another first pad to which the electric signal was not provided and the second pad, the first metal interconnect 135, the second metal interconnect 155, and the via structure 145 according to an embodiment of the present disclosure may be determined as normal.

On the other hand, when an electric signal is provided to a first pad and a second pad, and electric current flows between the first pad and the second pad and also between another first pad to which the electric signal was not provided and the second pad, the first metal interconnect 135, the second metal interconnect 155, and the via structure 145 according to an embodiment of the present disclosure may be determined as having a short-circuit failure.

Furthermore, when an electric signal is provided to a first pad and a second pad, and electric current does not flow between the first pad and the second pad, the first metal interconnect 135, the second metal interconnect 155, and the via structure 145 according to an embodiment of the present disclosure may be determined as having an open-circuit failure.

An optical inspection method among methods of inspecting failures of the semiconductor device may find almost all types of failures, but cannot identify major failures that directly affect a reduction of a yield rate. In addition, the optical inspection method requires much time because an apparatus used for the optical inspection performs inspection by scanning the semiconductor substrate. Accordingly, upon manufacturing a product, the optical inspection cannot be performed on the entirety of a semiconductor substrate. In addition, when the optical inspection is only performed on a specific region of the semiconductor substrate, the optical inspection method cannot detect all failures and has limitations in enhancing a manufacturing yield rate. However, the test method for the semiconductor device according to the present disclosure may detect failures accurately in a short time.

Figure 8:
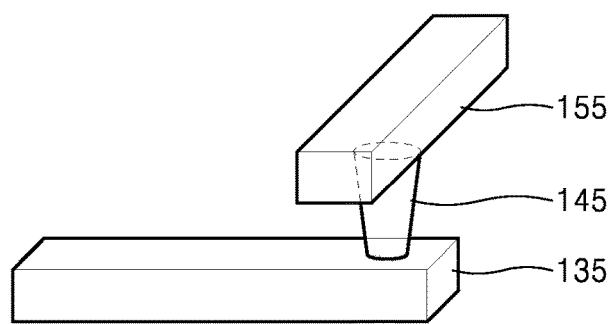
FIG. 8 is a perspective view showing a main part of a semiconductor device that is used in a test method for a semiconductor device according to an embodiment of the present disclosure.

FIG. 8 is a perspective view showing a main part of a test region of a semiconductor device that is used in a test method for a semiconductor device according to an embodiment of the present disclosure.

A perspective view showing a first metal interconnect 135, a via structure 145 formed on the first metal interconnect 135, and a second metal interconnect 155 formed on the via structure 145 is illustrated with reference to FIG. 8.

Ideally, the metal interconnects 135 and 155 and the via structure 145 should be formed as shown in the drawing. However, it is actually very difficult to form such an ideal structure due to several design variables and process variables in a real semiconductor device manufacturing process. In particular, in a process of forming the via structure 145, the current trend is to decrease the design rule, causing a decrease in a diameter of the via structure 145 and an increase in a height thereof. To this end, a considerable processing technology is required.

Accordingly, the present disclosure provides a test method for a semiconductor device that may easily detect process failures such as an open-circuit or a short-circuit of the via structure 145, which may occur in an actual semiconductor device manufacturing process, by utilizing a test pattern designed with an algorithm for variably (e.g., arbitrarily, disparately, or pseudo-randomly) positioning via patterns in multiple line patterns. The algorithm may be stored in a memory and executed using a tangible processor of, e.g., a computer.

Figure 9:
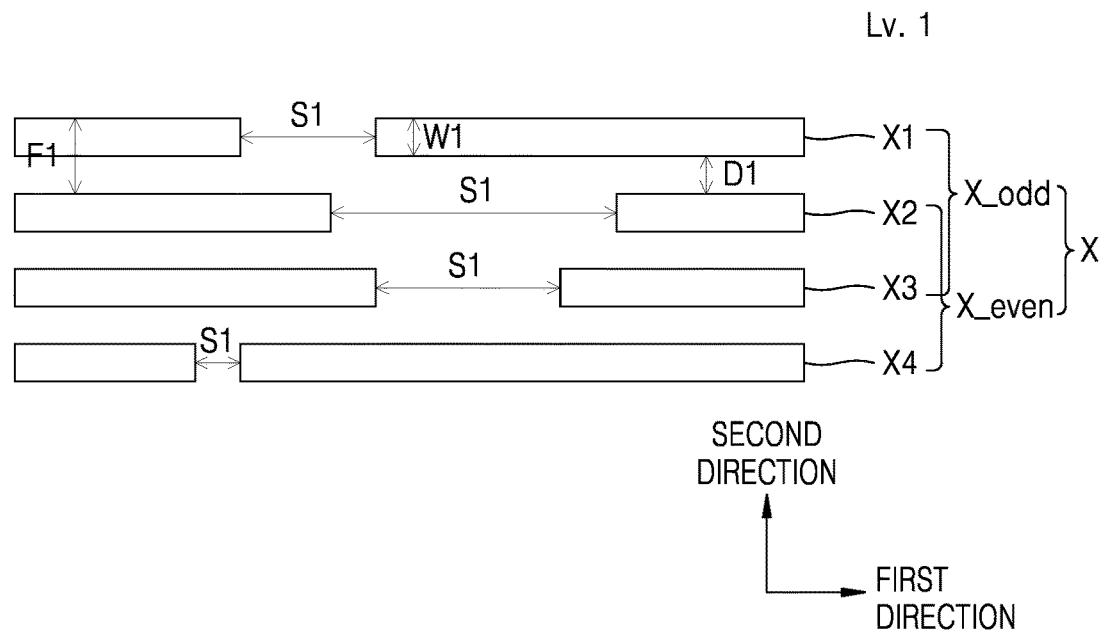
FIG. 9 is a plan view showing a test pattern formed at a first level according to an embodiment of the present disclosure.

FIG. 9 is a plan view showing a test pattern formed at a first level according to an embodiment of the present disclosure.

Multiple first line patterns X formed at a first level, extending in a first direction, having discontinuous regions spaced apart by a first space S1, and having a first width W1 are illustrated with reference to FIG. 9.

Different first line patterns X may have different first widths W1. Additionally, different adjacent first line patterns X may be separated by different first separation distances D1. A first pitch F1, which is a sum of the first width W1 and the first separation distance D1, may be the same for different first line patterns X, so that even when a first width W1 and a first separation distance D1 are not the same for two first line patterns X, the sum of the first pitch F1 is the same for different first line patterns X. The first width W1 denotes a length in a second direction perpendicular to the first direction.

The discontinuous regions of the first line patterns X may be variably (e.g., arbitrarily, pseudo-randomly) formed at the same position or at different positions in the second direction at the same first space S1 or at different first spaces S1. In addition, some of the first line patterns X may not include any discontinuous region or may include two or more discontinuous regions. FIG. 9 illustrates four first line patterns X, i.e., X1, X2, X3, and X4. However, embodiments of the present disclosure are not limited thereto.

Among the first line patterns X, odd-numbered patterns X_odd may form a first group, and even-numbered patterns X_even may form a second group. The first group may be formed at the first level and in a first color, and the second group may be formed at the first level and in a second color.

Figure 10:
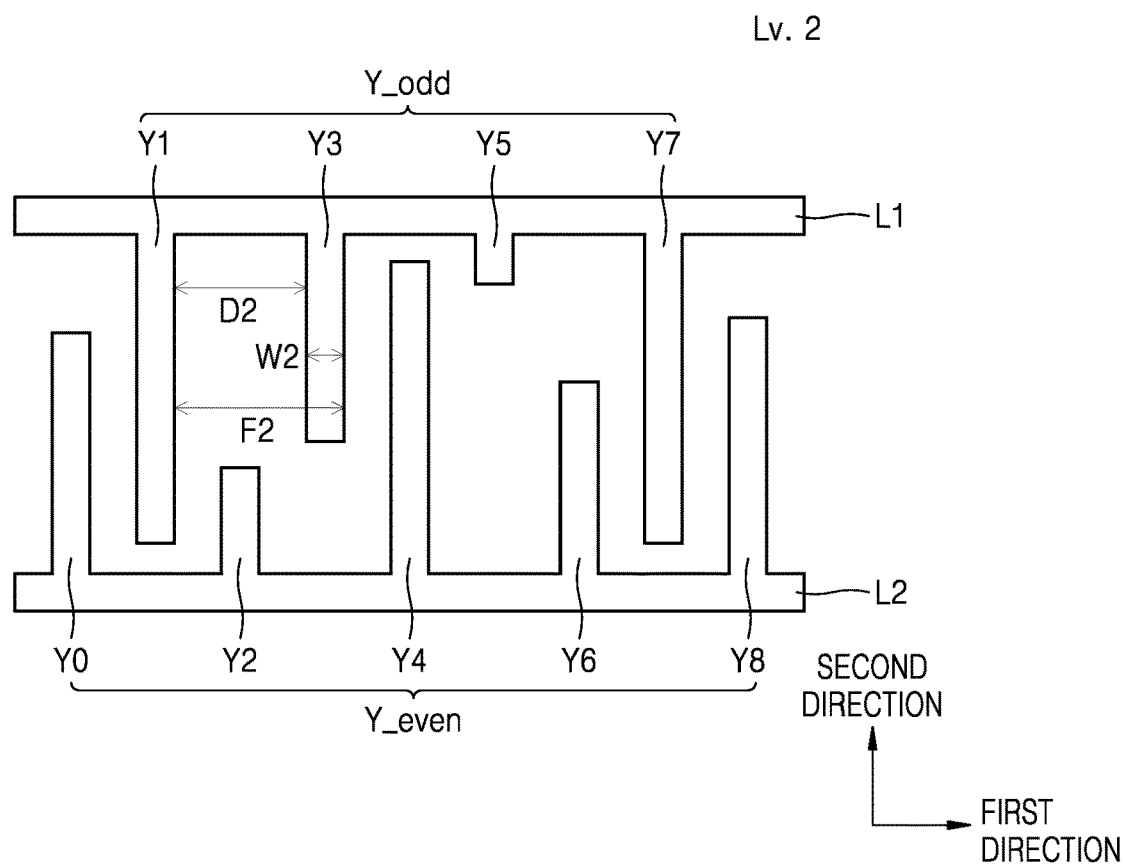
FIG. 10 is a plan view showing a test pattern formed at a second level according to an embodiment of the present disclosure.

FIG. 10 is a plan view showing a test pattern formed at a second level according to an embodiment of the present disclosure.

Connection line patterns L1 and L2 formed at the second level different from the first level, extending in the first direction, and separated from the first line patterns in the second direction perpendicular to the first direction, and the second line patterns Y formed at the second level, extending in the second direction, branching from the connection line patterns L1 and L2, and having a second width W2 are illustrated with reference to FIG. 10.

Different second line patterns Y may have different second widths W2. Additionally, different adjacent second line patterns Y may be separated by different second separation distances D2. A second pitch F2, which is a sum of the second width W2 and the second separation distance D2, may be the same. The second width W2 denotes a length in the first direction.

The connection line patterns L1 and L2 may include a first connection line pattern L1 and a second connection line pattern L2 which face each other with the first line patterns X (see FIG. 9) interposed therebetween. Among the second line patterns Y, odd-numbered patterns Y_odd may be branching from the first connection line pattern L1, and even-numbered patterns Y_even may be branching from the second connection line pattern L2. The connection line patterns L1 and L2 and the second line patterns Y may be perpendicular to each other. The second line patterns Y may extend to have different lengths in the second direction.

Among the second line patterns Y, each of the odd-numbered patterns Y_odd may be branching from the first connection line pattern L1 to form the shape of the letter "T" with the first connection line pattern L1, and each of the even-numbered patterns Y_even may be branching from the second connection line pattern L2 to form the shape of an inverted letter "T" with the second connection line pattern L2. FIG. 10 illustrates the second line patterns Y including four odd-numbered patterns Y_odd, i.e., Y1, Y3, Y5, and Y7 and five even-numbered patterns Y_even, i.e., Y0, Y2, Y4, Y6, and Y8. However, embodiments of the present disclosure are not limited thereto.

The first connection line pattern L1 and the odd-numbered patterns Y_odd among the second line patterns Y may be formed at the second level and in a third color, and the second connection line pattern L2 and the even-numbered patterns Y_even among the second line patterns Y may be formed at the second level and in a fourth color.

Figure 11:
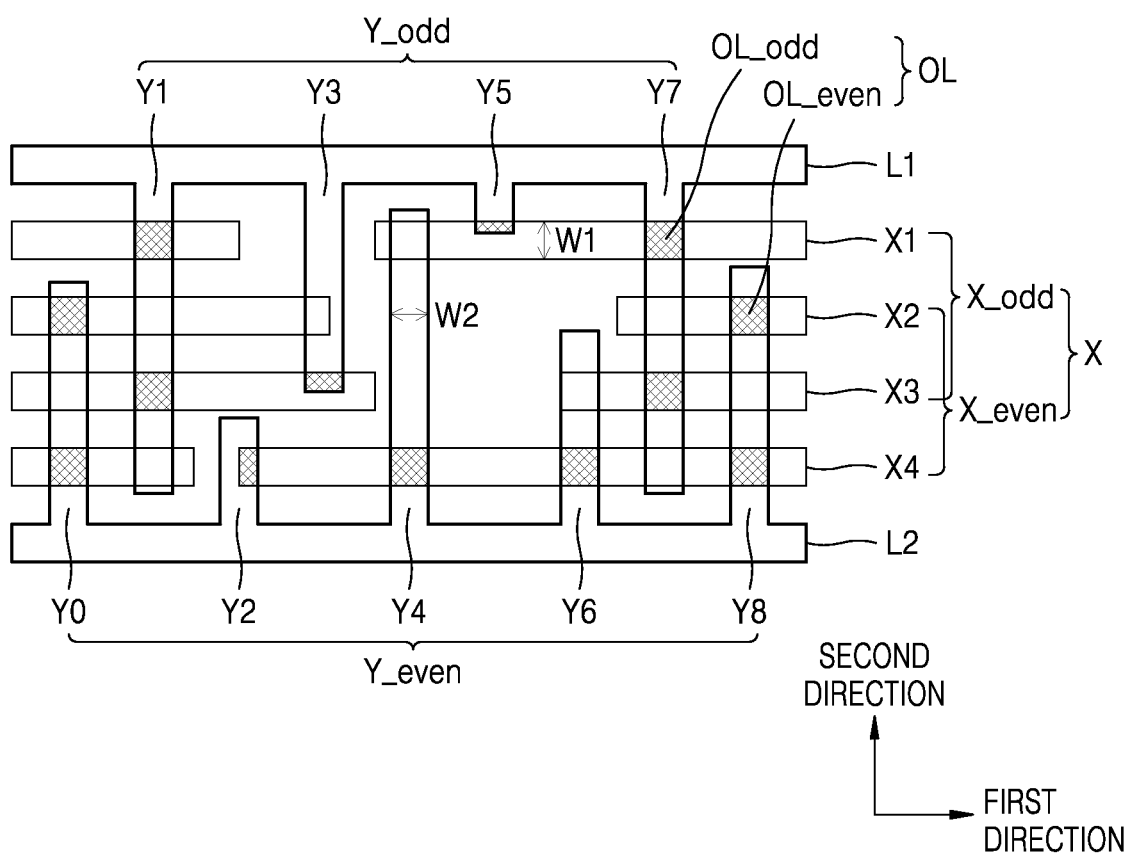
FIG. 11 is a plan view showing test patterns formed at a first level and a second level according to an embodiment of the present disclosure.

FIG. 11 is a plan view showing test patterns formed at a first level and a second level according to an embodiment of the present disclosure.

A first intersection region OL_odd with the first width W1 of the first line pattern X_odd of the first group and the second width W2 of the second line pattern Y_odd branching from the first connection line pattern L1 and a second intersection region OL_even with the first width W1 of the first line pattern X_even of the second group and the second width W2 of the second line pattern Y_even branching from the second connection line pattern L2 are illustrated with reference to FIG. 11.

By performing the above-described design task, the first line patterns X formed at the first level may intersect the second line patterns Y formed at the second level. According to an embodiment of the present disclosure, the first intersection region OL_odd with the first width W1 of any one of the first line patterns X1 and X3 of the first group and the second width W2 of any one of the second line patterns Y1, Y3, Y5, and Y7 branching from the first connection line pattern L1 and the second intersection region OL_even with the first width W1 of any one of the first line pattern X2 and X4 of the second group and the second width W2 of any one of the second line patterns Y0, Y2, Y4, Y6, and Y8 branching from the second connection line pattern L2 are included.

For convenience of description, FIG. 11 shows that the first line patterns X and the second line patterns Y have the same width. However, patterns having different widths may be used as described above. Here, the first intersection region OL_odd and the second intersection region OL_even may have the shape of a rectangle rather than a shape of a square as shown in the drawings. That is, the first intersection region OL_odd and the second intersection region OL_even may have various shapes.

Figure 12:
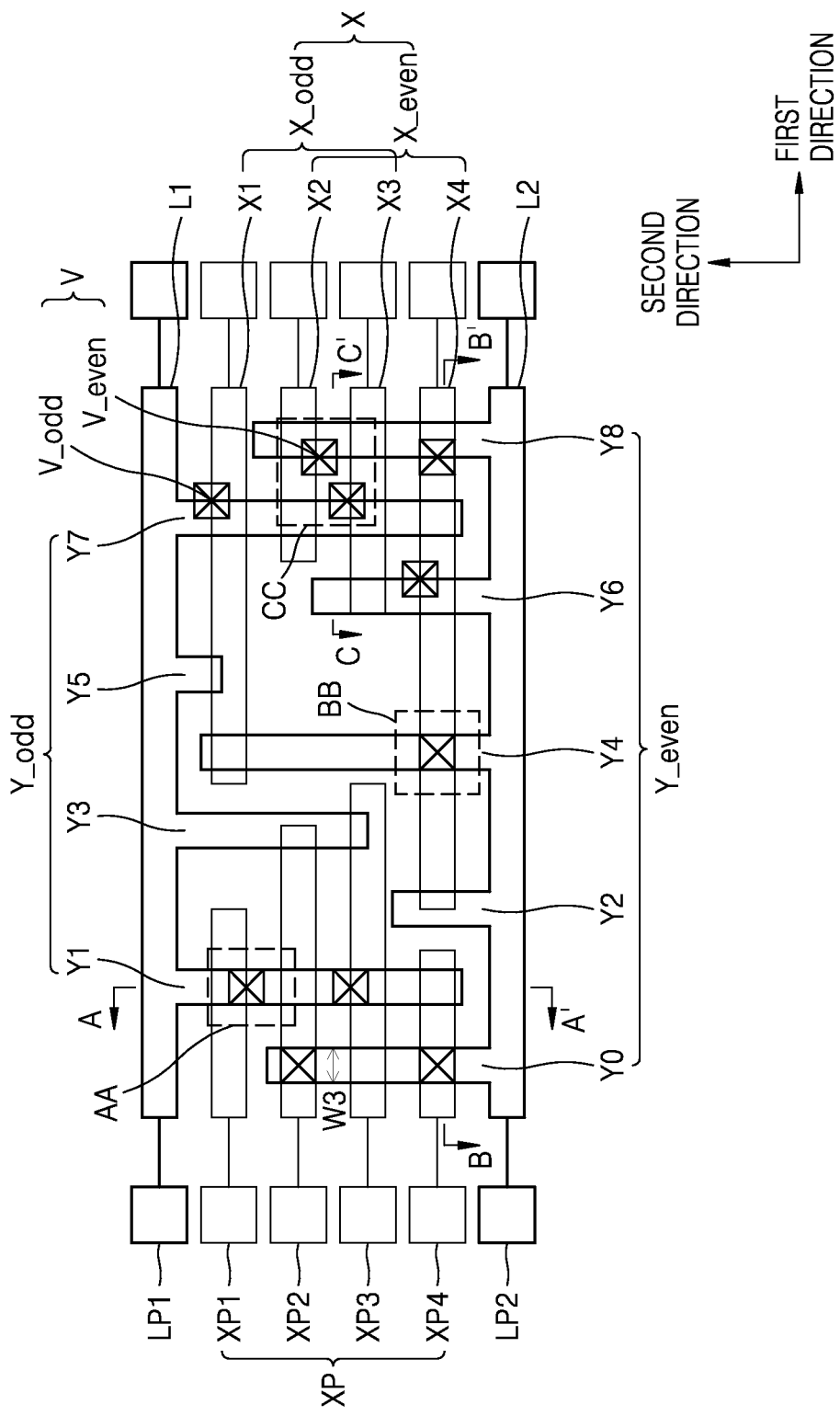
FIG. 12 is a plan view showing test patterns formed at a first level and a second level according to an embodiment of the present disclosure.

FIG. 12 is a plan view showing test patterns formed at a first level and a second level according to an embodiment of the present disclosure.

A first via pattern V_odd formed in the first intersection region OL_odd (see FIG. 11) and a second via pattern V_even formed in the second intersection region OL_even (see FIG. 11) are illustrated with reference to FIG. 12.

A center of the intersection region OL (see FIG. 11) and a center of the via pattern V may be vertically matched to or horizontally separated by a variable distance from each other so that the via patterns V at least partially overlap the intersection region OL (see FIG. 11).

The via patterns V may have a third width W3 and may be variably (e.g., arbitrarily, pseudo-randomly) formed as long as the via patterns V are not in a range that overlaps or is in contact with the other via patterns V formed in the different pluralities of line patterns X and Y. That is, the via patterns V may be variably (e.g., arbitrarily, pseudo-randomly) positioned in the intersection region OL between the first line patterns X and the second line patterns Y in terms of position, size, or overlapped area as long as the design rule is met. The via patterns V may be formed at a third level rather than at the first level and the second level and in a fifth color.

Repetitive description associated with the via patterns V will be omitted.

Figure 13:
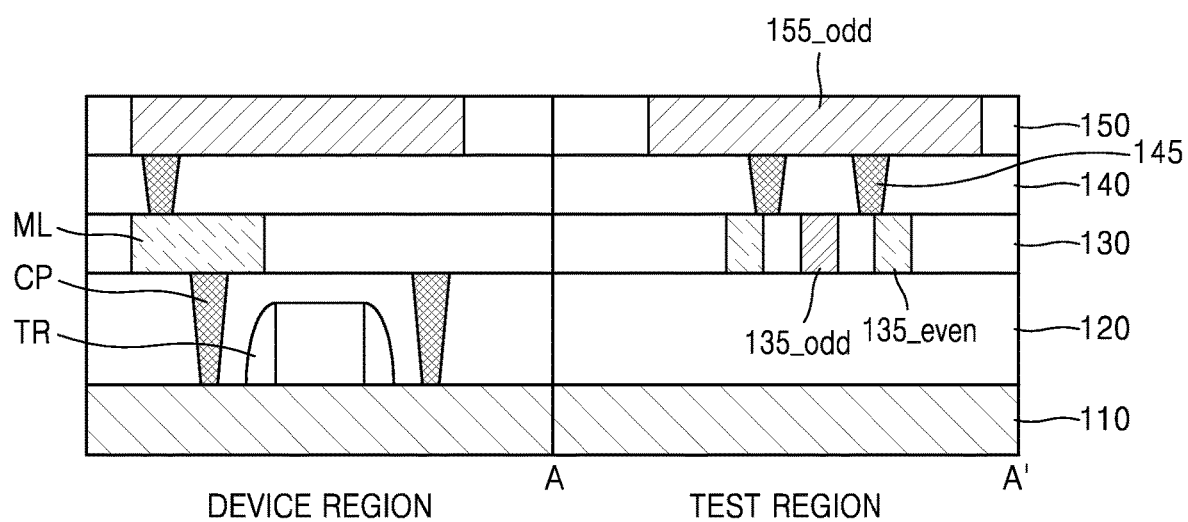
FIG. 13 is a cross sectional view of a semiconductor device that is used in a test method for a semiconductor device according to an embodiment of the present disclosure.
Figure 13:
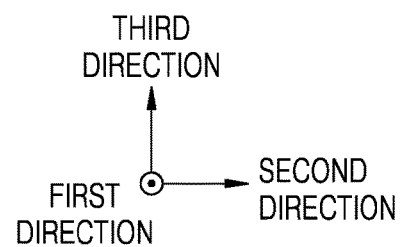

FIG. 13 is a cross sectional view of a semiconductor device that is used in a test method for a semiconductor device according to an embodiment of the present disclosure.

A cross sectional view of the semiconductor device processed with a mask including the test pattern of FIG. 12 taken along line A-A' having, as its center, a part of the semiconductor device corresponding to region AA of FIG. 12 is illustrated with reference to FIGS. 12 and 13.

A process of manufacturing the semiconductor device using the test pattern of FIG. 12 is as follows. A substrate 110 including a device region and a test region is prepared. An interlayer insulating film 120 is formed on the test region of the substrate 110. A photolithography process and an etching process are performed on a first interconnect layer 130 disposed on the interlayer insulating film 120 in order to form multiple first metal interconnects 135_odd and 135_even using the mask including the test pattern of FIG. 12 corresponding to the first line patterns X_odd and X_even at the first level of the test pattern. A photolithography process and an etching process are performed on a first via layer 140 of the test region in order to form multiple via structures 145 using the mask including the test pattern of FIG. 12 corresponding to the via patterns V at the third level of the test pattern. A photolithography process and an etching process are performed on a second interconnect layer 150 of the test region in order to form a metal connection line (not shown), multiple second metal interconnects 155_odd, and multiple second metal interconnects (not shown) using the mask including the test pattern of FIG. 12 corresponding to the connection line patterns L1 and L2 at the second level of the test pattern, the second line patterns Y_odd, and the second line patterns Y_even. The first interconnect layer 130, the second interconnect layer 150, and the first via layer 140 may each include an insulating film.

Repetitive description associated with the regions and materials of the semiconductor device will be omitted.

In region AA of FIG. 12, the via patterns V are formed adjacent to one another. The test pattern is formed to meet the design rule. However, when the test pattern is actually implemented in a semiconductor device, adjacent via patterns V may induce an open-circuit or short-circuit failure due to limitations in a process, etc. When designed via patterns V are disposed without failures in the semiconductor device, a designed space of the via patterns V may actually be implemented in the semiconductor device.

A test method for a semiconductor device may include forming first pads that are electrically connected with the first metal interconnects 135_odd and 135_even and each correspond to a first test pad XP connected with a first line pattern X of the test pattern, and a second pad that is electrically connected with the metal connection line (not shown) and corresponds to the second test pads LP1 and LP2 connected with connection line patterns L1 and L2 of the test pattern, providing an electric signal to the second pad and one of the first pads, and examining failures of the first metal interconnect 135, the second metal interconnect 155, and the via structure 145 using the electric signal. The first pad and the second pad may be present at the same level.

According to the test method of the semiconductor device according to the present disclosure, the failures can be accurately detected in a short time. The first pad electrically connected with the first metal interconnect 135_odd and the second pad electrically connected with the metal connection line (not shown) will be described below as an example.

When an electric signal is provided to a first pad and a second pad, and electric current flows between the first pad and the second pad while not flowing between another first pad to which the electric signal was not provided and the second pad, the first metal interconnect 135, the second metal interconnect 155, and the via structure 145 according to an embodiment of the present disclosure may be determined as normal.

On the other hand, when an electric signal is provided to a first pad and a second pad, and electric current flows between the first pad and the second pad and also between another first pad to which the electric signal was not provided and the second pad, the first metal interconnect 135, the second metal interconnect 155, and the via structure 145 according to an embodiment of the present disclosure may be determined as having a short-circuit failure.

Furthermore, when an electric signal is provided to a first pad and a second pad, and electric current does not flow between the first pad and the second pad, the first metal interconnect 135, the second metal interconnect 155, and the via structure 145 according to an embodiment of the present disclosure may be determined as having an open-circuit failure.

Repetitive description associated with the test method for the semiconductor device will be omitted.

Figure 14:
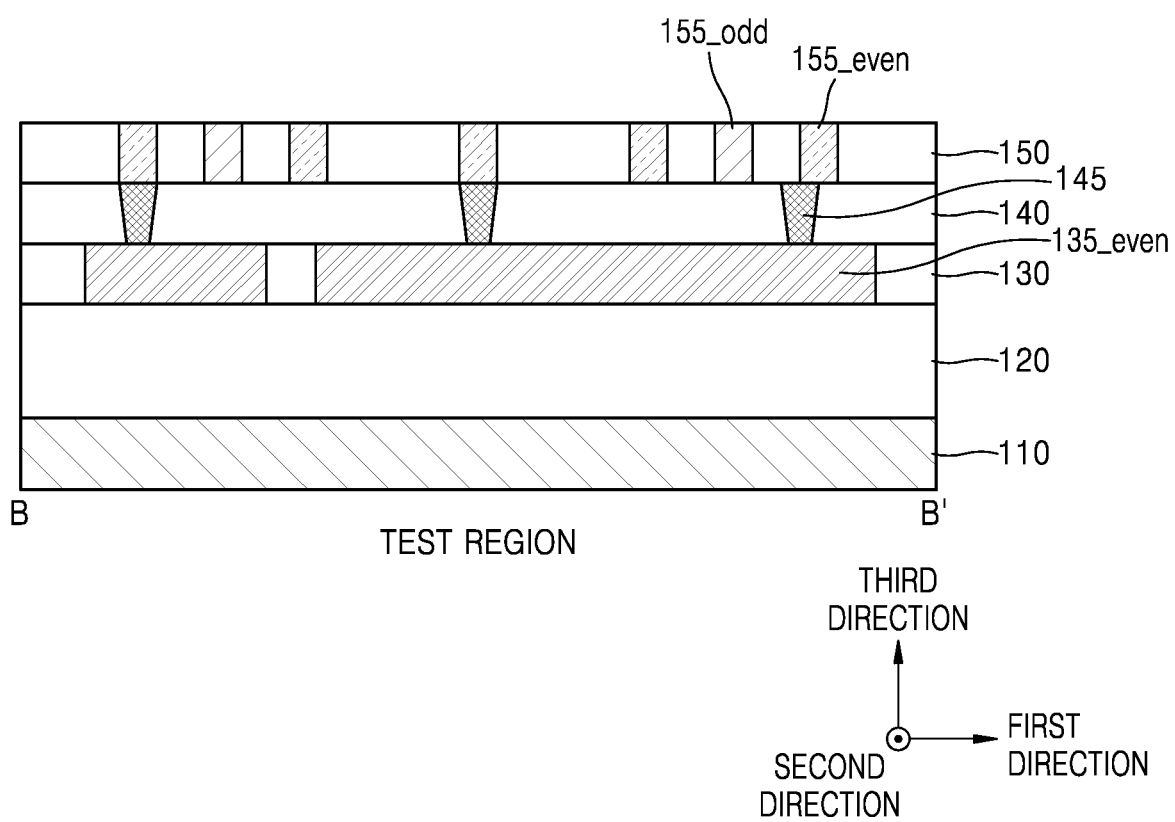
FIG. 14 is a cross sectional view of a semiconductor device that is used in a test method for a semiconductor device according to an embodiment of the present disclosure.

FIG. 14 is a cross sectional view of a semiconductor device that is used in a test method for a semiconductor device according to an embodiment of the present disclosure.

A cross sectional view of the semiconductor device processed with a mask including the test pattern of FIG. 12 taken along line B-B' having, as its center, a part of the semiconductor device corresponding to region BB of FIG. 12 is illustrated with reference to FIGS. 12 and 14.

A method of manufacturing the semiconductor device using the test pattern of FIG. 12 is as follows. A substrate 110 including a device region and a test region is prepared. The device region may not be shown along a cutting direction of the substrate 110. An interlayer insulating film 120 is formed on the test region of the substrate 110. A photolithography process and an etching process are performed on a first interconnect layer 130 disposed on the interlayer insulating film 120 in order to form multiple first metal interconnects (not shown) and multiple first metal interconnects 135_even using the mask including the test pattern of FIG. 12 corresponding to the first line patterns X_odd and the first line patterns X_even at a first level of the test pattern. A photolithography process and an etching process are performed on a first via layer 140 of the test region in order to form multiple via structures 145 using the mask including the test pattern of FIG. 12 corresponding to the via patterns V at a third level of the test pattern. A photolithography process and an etching process are performed on a second interconnect layer 150 of the test region in order to form a metal connection line (not shown) and multiple second metal interconnects 155_odd and 155_even using the mask including the test pattern of FIG. 12 corresponding to the second line patterns Y_odd and Y_even and the connection line patterns L1 and L2 at a second level of the test pattern. The first interconnect layer 130, the second interconnect layer 150, and the first via layer 140 may each include an insulating film.

Repetitive description associated with the regions and materials of the semiconductor device will be omitted.

In region BB of FIG. 12, the via patterns V are illustrated as being independently formed far away from one another in one second line pattern Y1. The test pattern is formed to meet the design rule. However, when the test pattern is actually implemented in a semiconductor device, the independent via pattern may induce an open-circuit failure due to limitations in a process, etc. When designed via patterns V are implemented without failures as the via structures 145 in the semiconductor device, a designed space of the via patterns V may actually be implemented in the semiconductor device.

A test method for a semiconductor device may include forming first pads that are electrically connected with the first metal interconnects 135_even and each correspond to a first test pad XP4 connected with a first line pattern X4 of the test pattern, and a second pad that is electrically connected with the metal connection line (not shown) and corresponds to a second test pad LP2 connected with a second connection line pattern L2 of the test pattern, providing an electric signal to the second pad and one of the first pads, and examining failures of the first metal interconnect 135, the second metal interconnect 155, and the via structure 145 using the electric signal. The first pad and the second pad may be present at the same level.

Repetitive description associated with the test method for the semiconductor device will be omitted.

Figure 15:
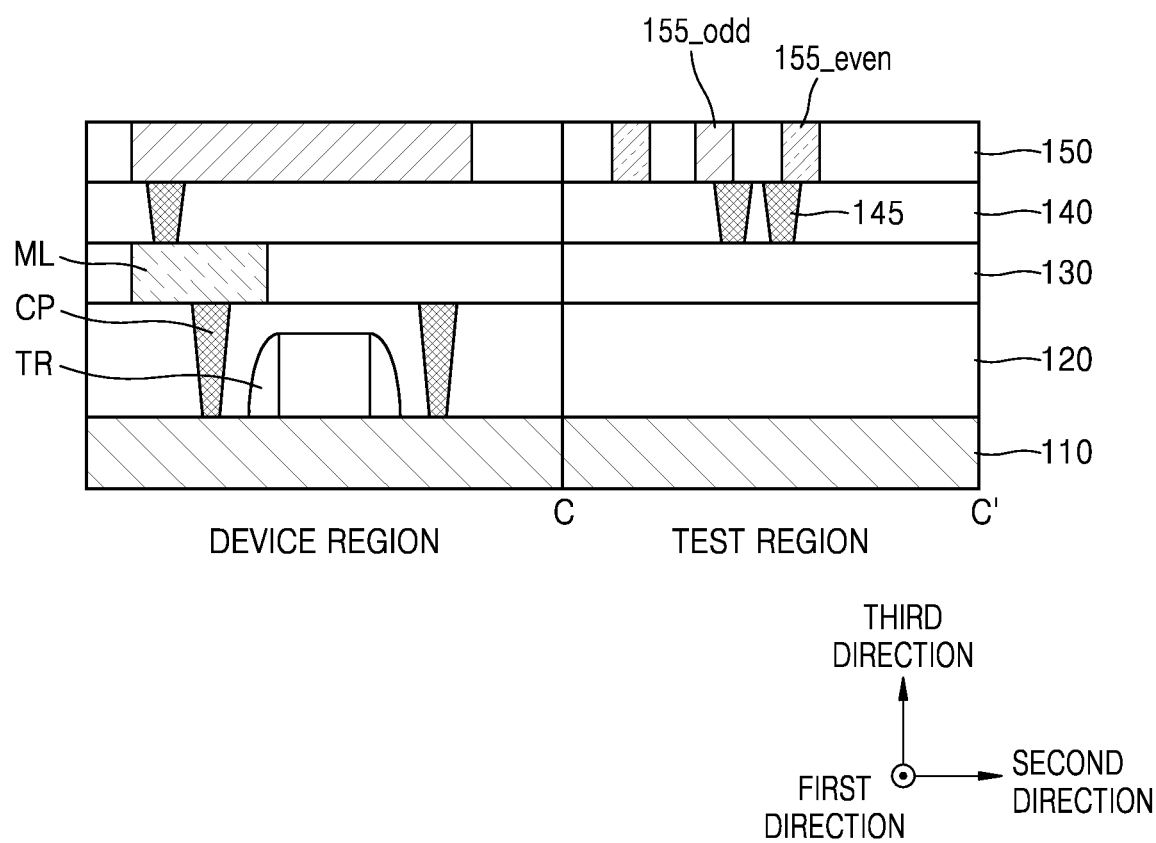
FIG. 15 is a cross sectional view of a semiconductor device that is used in a test method for a semiconductor device according to an embodiment of the present disclosure.

FIG. 15 is a cross sectional view of a semiconductor device that is used in a test method for a semiconductor device according to an embodiment of the present disclosure.

A cross sectional view of the semiconductor device processed with a mask including the test pattern of FIG. 12 taken along line C-C' having, as its center, a part of the semiconductor device corresponding to region CC of FIG. 12 is illustrated with reference to FIGS. 12 and 15.

A method of manufacturing the semiconductor device using the test pattern of FIG. 12 is as follows. A substrate 110 including a device region and a test region is prepared. An interlayer insulating film 120 is formed on the test region of the substrate 110. A photolithography process and an etching process are performed on a first interconnect layer 130 disposed on the interlayer insulating film 120 in order to form multiple first metal interconnects (not shown) using the mask including the test pattern of FIG. 12 corresponding to the first line patterns X_odd and X_even at a first level of the test pattern. A photolithography process and an etching process are performed on a first via layer 140 of the test region in order to form multiple via structures 145 using the mask including the test pattern of FIG. 12 corresponding to the via patterns V at a third level of the test pattern. A photolithography process and an etching process are performed on a second interconnect layer 150 of the test region in order to form a metal connection line (not shown) and multiple second metal interconnects 155_odd and 155_even using the mask including the test pattern of FIG. 12 corresponding to the second line patterns Y_odd and Y_even and the connection line patterns L1 and L2 at a second level of the test pattern. The first interconnect layer 130, the second interconnect layer 150, and the first via layer 140 may each include an insulating film.

Repetitive description associated with the regions and materials of the semiconductor device will be omitted.

In region CC of FIG. 12, the via patterns V are formed maximally adjacent to one another in the second line patterns Y7 and Y8. The test pattern is formed to meet the design rule. However, when the test pattern is actually implemented in a semiconductor device, an adjacent via pattern may induce an open-circuit or short-circuit failure due to limitations in a process, etc. When designed via patterns V are implemented without failures as the via structures 145 in the semiconductor device, a designed space of the via patterns V may actually be implemented in the semiconductor device.

A test method for a semiconductor device may include forming first pads that are electrically connected with the first metal interconnects (not shown) and correspond to first test pads XP2 and XP3 connected with first line patterns X2 and X3 of the test pattern, and a second pad that is electrically connected with the metal connection line (not shown) and corresponds to a second test pad LP1 connected with the first connection line pattern L1 of the test pattern and a second test pad LP2 connected with the second connection line pattern L2 of the test pattern, providing an electric signal to the second pad and one of the first pads, and examining failures of the first metal interconnect 135, the second metal interconnect 155, and the via structure 145 using the electric signal. The first pad and the second pad may be present at the same level.

Repetitive description associated with the test method for the semiconductor device will be omitted.

Figure 16:
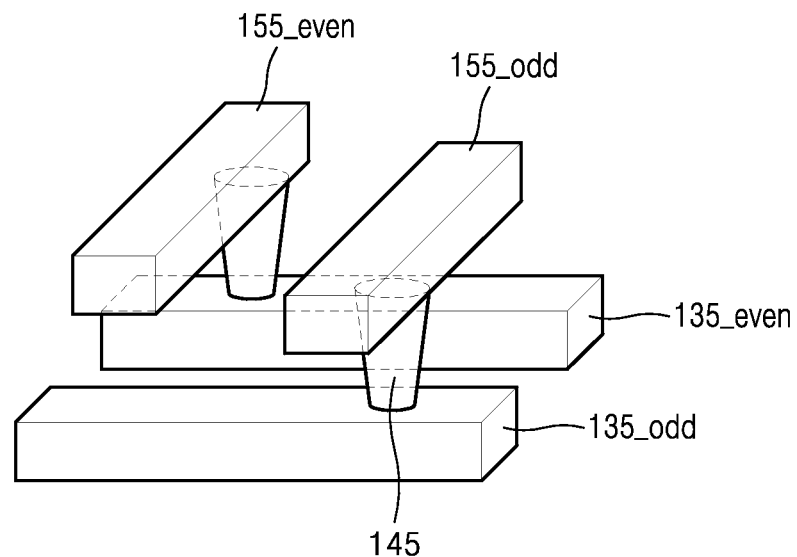
FIG. 16 is a perspective view showing a main part of a semiconductor device that is used in a test method for a semiconductor device according to an embodiment of the present disclosure.

FIG. 16 is a perspective view showing a main part of a test region of a semiconductor device that is used in a test method for a semiconductor device according to an embodiment of the present disclosure.

A perspective view showing the first metal interconnect 135_odd of a first group, the first via structure 145 formed on the first metal interconnect 135_odd of the first group, the first metal interconnect 135_even of a second group and the odd-numbered second metal interconnect 155_odd formed on the first via structure 145, the first via structure 145 formed on the first metal interconnect 135_even of the second group, and the even-numbered second metal interconnect 155_even formed on the first via structure 145 is illustrated with reference to FIG. 16.

Ideally, the metal interconnects 135_odd, 135_even, 155_odd, and 155_even and the via structure 145 should be formed as shown in the drawing. However, it is actually very difficult to form such an ideal structure due to several design variables and process variables in a real semiconductor device manufacturing process. In particular, in a process of forming the via structure 145, the current trend is to decrease the design rule, causing a decrease in a diameter of the via structure 145 and an increase in a height thereof. To this end, a considerable processing technology is required.

Accordingly, the present disclosure provides a test method for a semiconductor device that may easily detect process failures such as an open-circuit or a short-circuit of the via structure 145, which may occur in an actual semiconductor device manufacturing process, by utilizing a test pattern designed with an algorithm for variably (e.g., arbitrarily, pseudo-randomly) positioning via patterns in multiple line patterns. The algorithm may be stored in a memory and executed using a tangible processor of, e.g., a computer.

Figure 17:
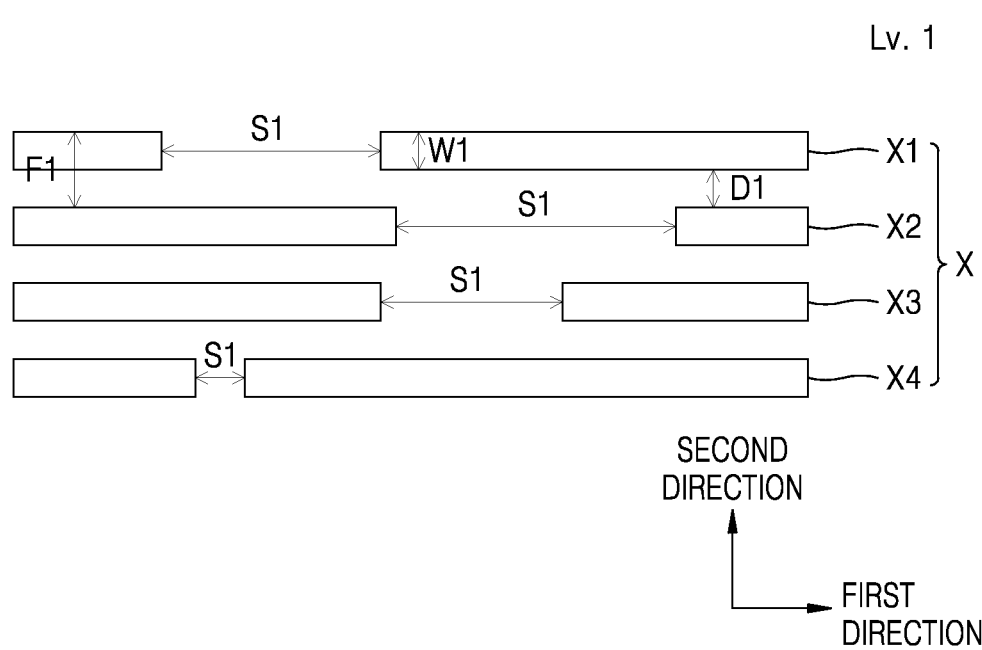
FIG. 17 is a plan view showing a test pattern formed at a first level according to an embodiment of the present disclosure.

FIG. 17 is a plan view showing a test pattern formed at a first level according to an embodiment of the present disclosure.

Multiple first line patterns X formed at a first level, extending in a first direction, having discontinuous regions spaced apart by a first space S1, and having a first width W1 are illustrated with reference to FIG. 17.

The first line patterns X may be formed at the first level and in a first color. Different first line patterns X may have different first widths W1. Additionally, different adjacent first line patterns X may be separated by different first separation distances D1. A first pitch F1, which is a sum of the first width W1 and the first separation distance D1, may be the same for different first line patterns X, so that even when a first width W1 and a first separation distance D1 are not the same for two first line patterns X, the sum of the first pitch F1 is the same for different first line patterns X. The first width W1 denotes a length in a second direction perpendicular to the first direction.

The discontinuous regions of the first line patterns X may be variably formed at the same position or at different positions in the second direction at the same first space S1 or at different first spaces S1. In addition, some of the first line patterns X may not include any discontinuous region or may include two or more discontinuous regions. FIG. 17 illustrates four first line patterns X, i.e., X1, X2, X3, and X4. However, embodiments of the present disclosure are not limited thereto.

Figure 18:
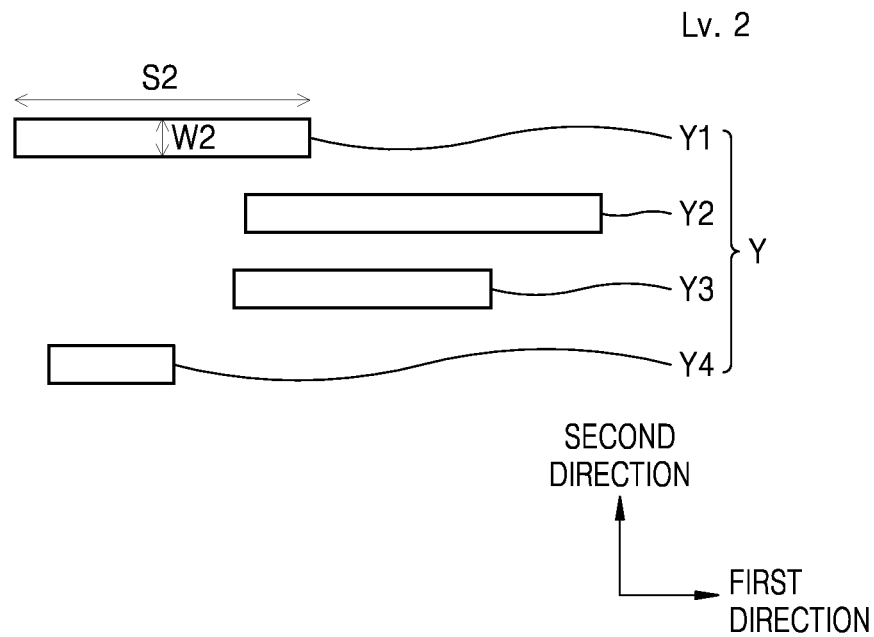
FIG. 18 is a plan view showing a test pattern formed at a second level according to an embodiment of the present disclosure.

FIG. 18 is a plan view showing a test pattern formed at a second level according to an embodiment of the present disclosure.

Multiple second line patterns Y formed at the second level, extending in the first direction, having a first length S2 greater than a length of the first space S1 in order to include discontinuous regions of the first line patterns X (see FIG. 17), and having a second width W2 are illustrated with reference to FIG. 18.

The second line patterns Y may have positions and lengths corresponding to the first line patterns X (see FIG. 17). That is, the first line patterns X (see FIG. 17) may have different discontinuous regions, and the second line patterns Y may have the first length S2 that may include all of the discontinuous regions. The second width W2 of each of the second line patterns Y may be formed to be the same as the first width W1 of each of the first line patterns X (see FIG. 17), but is not limited thereto. The second width W2 denotes a length in the second direction perpendicular to the first direction.

The second line patterns Y may extend to have different first lengths S2 in the first direction. FIG. 18 illustrates four second line patterns Y, i.e., Y1, Y2, Y3, and Y4, but embodiments are not limited thereto.

Figure 19:
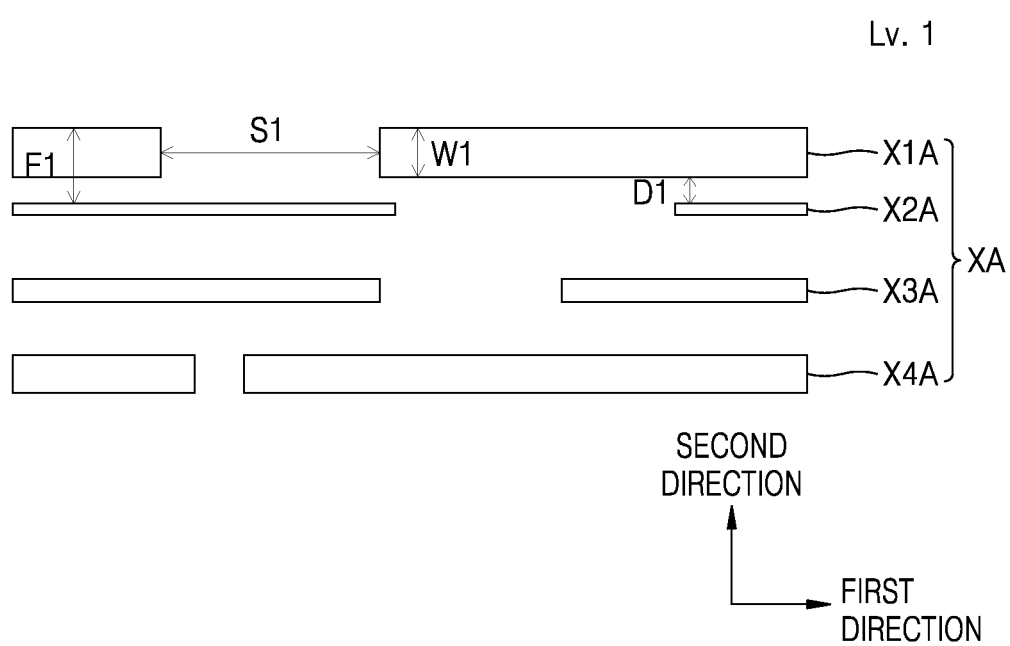
FIG. 19 is a plan view showing a test pattern formed at a first level according to an embodiment of the present disclosure.

FIG. 19 is a plan view showing a test pattern formed at a first level according to an embodiment of the present disclosure.

Multiple first line patterns XA having different first widths W1 and different first separation distances D1 are illustrated with reference to FIG. 19.

Different first line patterns XA may have different first widths W1. Additionally, different adjacent first line patterns XA may be separated by different first separation distances D1. A first pitch F1, which is a sum of the first width W1 and the first separation distance D1, may be the same for different first line patterns XA, so that even when a first width W1 and a first separation distance D1 are not the same for two first line patterns XA, the sum of the first pitch F1 is the same for different first line patterns XA. That is, the first line patterns XA may have the same first pitch F1, but are not limited thereto. The first width W1 denotes a length in the second direction perpendicular to the first direction.

Figure 20:
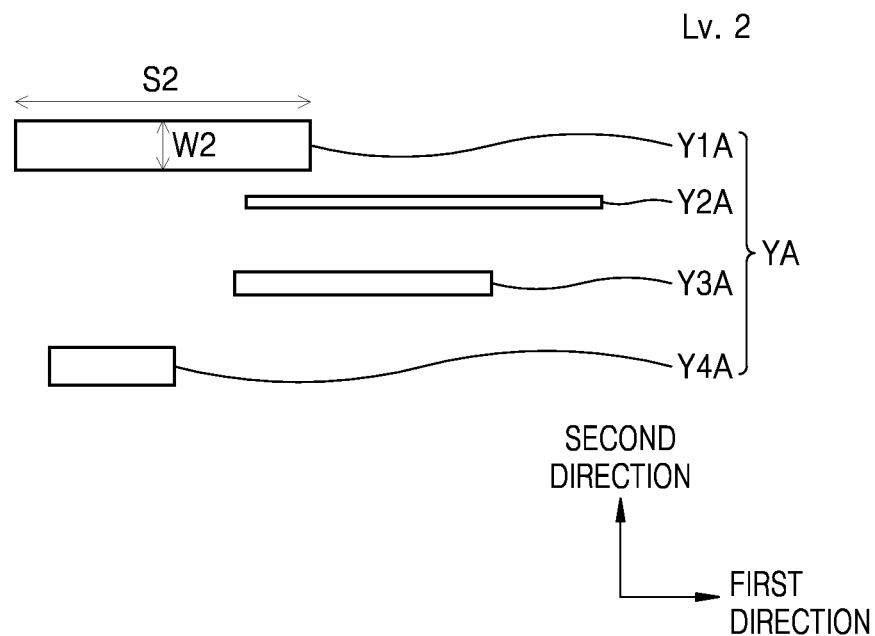
FIG. 20 is a plan view showing a test pattern formed at a second level according to an embodiment of the present disclosure.

FIG. 20 is a plan view showing a test pattern formed at a second level according to an embodiment of the present disclosure.

Multiple second line patterns YA formed at the second level, extending in the first direction, having a first length S2 greater than a length of the first space S1 in order to include discontinuous regions of the first line patterns XA (see FIG. 19), and having different first widths W1 are illustrated with reference to FIG. 20.

The second line patterns YA may have positions and lengths corresponding to the first line patterns XA (see FIG. 19). That is, the first line patterns XA (see FIG. 19) may have different discontinuous regions, and the second line patterns YA may have the first length S2 that may include all of the discontinuous regions. The first width W1 of each of the second line patterns YA may be formed to be the same as the first width W1 of each of the first line patterns XA (see FIG. 19), but is not limited thereto. The second width W2 denotes a length in the second direction perpendicular to the first direction.

Figure 21:
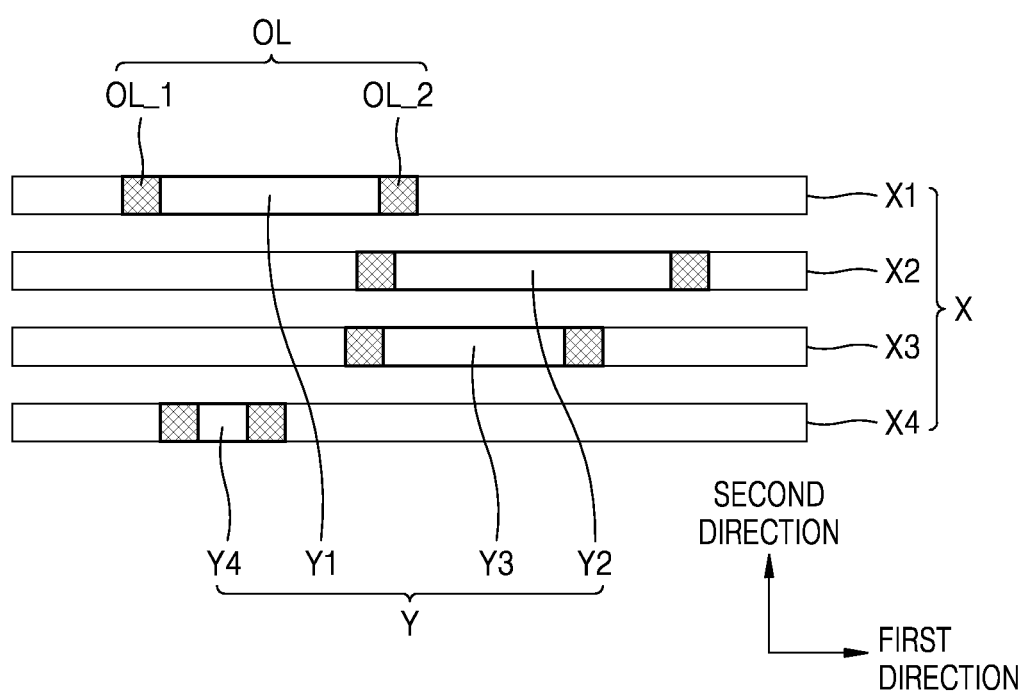
FIG. 21 is a plan view showing test patterns formed at a first level and a second level according to an embodiment of the present disclosure.

FIG. 21 is a plan view showing test patterns formed at a first level and a second level according to an embodiment of the present disclosure.

Overlap regions OL between the first line patterns X formed at the first level and the second line patterns Y formed at the second level are illustrated with reference to FIG. 21.

By performing the above-described design task, the first line patterns X formed at the first level and the second line patterns Y formed at the second level may be formed to overlap each other. According to an embodiment of the present disclosure, a first overlap region OL_1, which is a region in which the first line pattern X and the second line pattern Y overlap at one end, and a second overlap region OL_2, which is a region in which the first line pattern X and the second line pattern Y overlap at the other end, may be formed. The first line patterns X may have at least two overlap regions OL with the second line patterns Y.

FIG. 21 shows that the first line patterns X formed at the first level and the second line patterns Y formed at the second level, which are shown in FIGS. 17 and 18, intersect each other. However, instead of the first line patterns X shown in FIG. 17, the first line patterns XA shown in FIG. 19 may be used, and instead of second line patterns Y shown in FIG. 18, the second line patterns YA shown in FIG. 20 may be used. Here, the overlap regions OL may have the shape of a rectangle rather than a shape of a square as shown in the drawings. That is, the overlap regions OL may have various shapes.

When viewed from the top, the first line patterns X overlap the second line patterns Y in the form of several lines. That is, the first line patterns X may be shown as overlapping the second line patterns Y in the form of a connection line pattern having no discontinuous regions.

Figure 22:
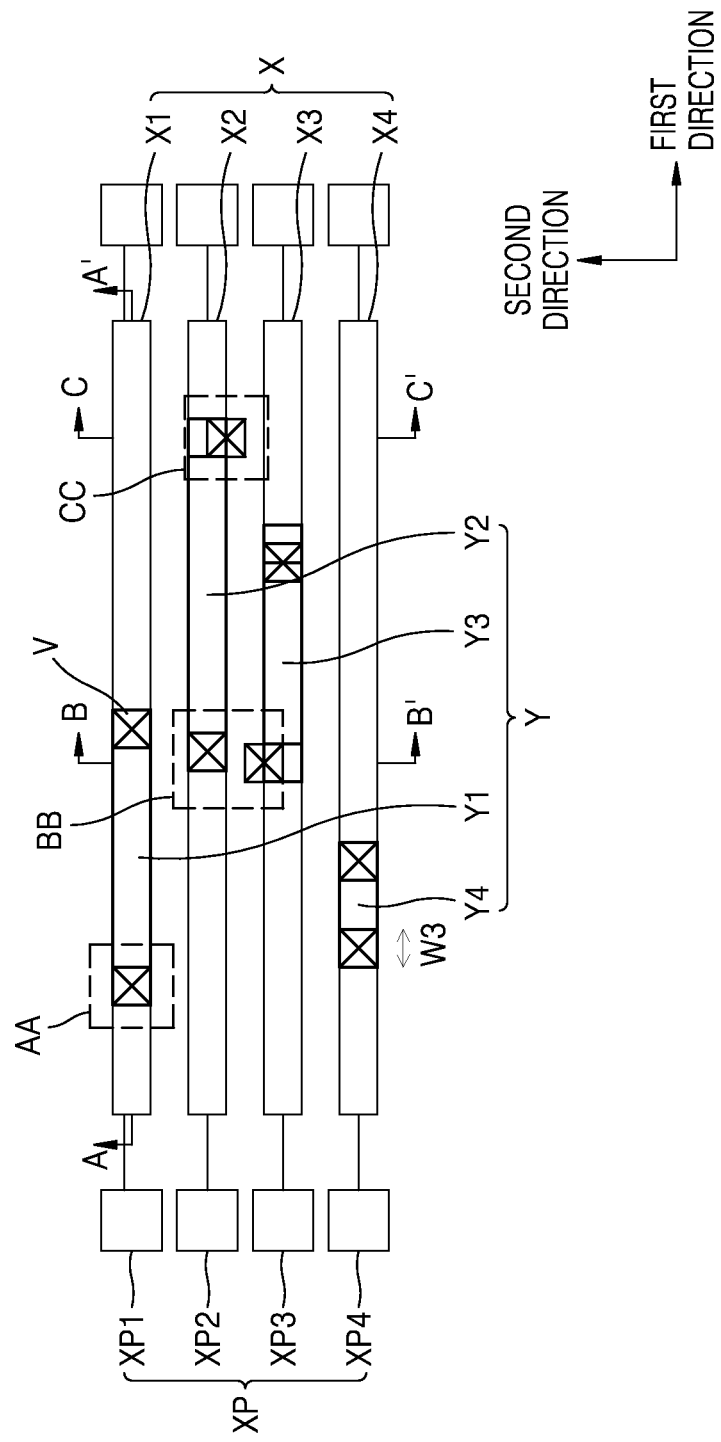
FIG. 22 is a plan view showing test patterns formed at a first level and a second level according to an embodiment of the present disclosure.

FIG. 22 is a plan view showing test patterns formed at a first level and a second level according to an embodiment of the present disclosure.

Multiple via patterns V formed in the overlap region OL (see FIG. 21) are illustrated with reference to FIG. 22.

A center of the overlap region OL (see FIG. 21) and a center of the via pattern V may be vertically matched to or horizontally separated by a variable distance from each other so that the via patterns V at least partially overlap the overlap region OL (see FIG. 21).

The via patterns V may have a third width W3 and may be variably formed as long as the via patterns V are not in a range that overlaps or is in contact with other via patterns V formed in another line patterns.

That is, the via patterns V may be variably (e.g., arbitrarily, pseudo-randomly) positioned in the overlap region OL (see FIG. 21) between the first line patterns X and the second line patterns Y in terms of position, size, or overlapped area as long as the design rule is met. The via patterns V may be formed at a third level rather than at the first level and the second level and in a third color.

Figure 23:
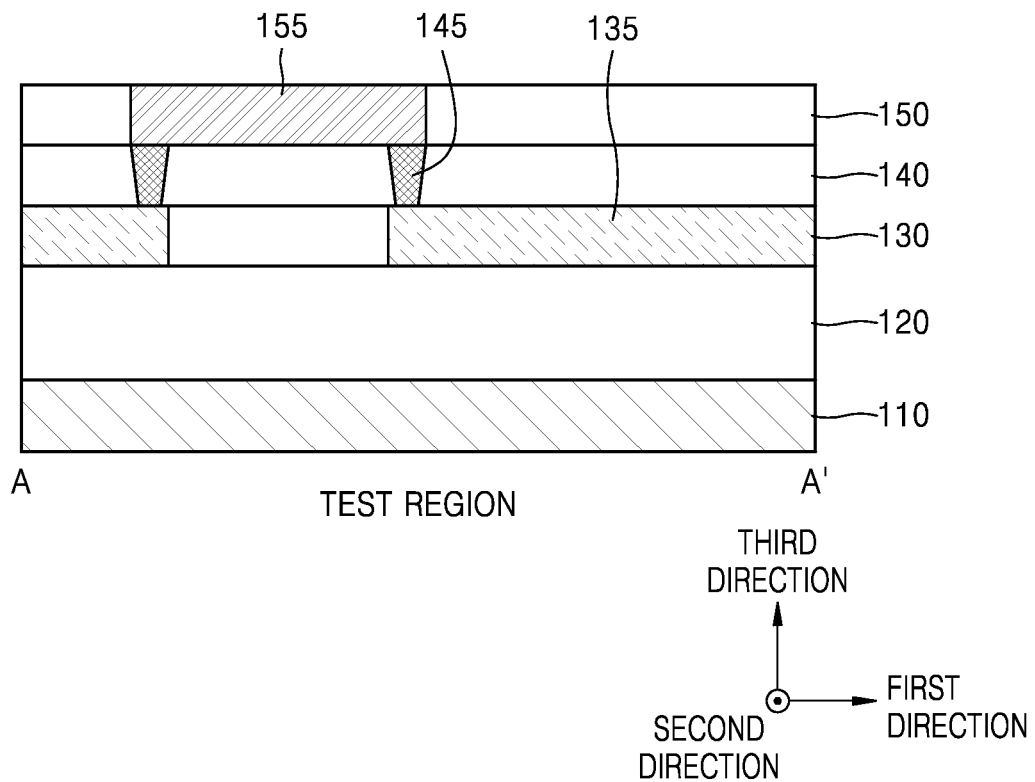
FIG. 23 is a cross sectional view of a semiconductor device that is used in a test method for a semiconductor device according to an embodiment of the present disclosure.

FIG. 23 is a cross sectional view of a semiconductor device that is used in a test method for a semiconductor device according to an embodiment of the present disclosure.

A cross sectional view of the semiconductor device processed with a mask including the test pattern of FIG. 22 taken along line A-A' having, as its center, a part of the semiconductor device corresponding to region AA of FIG. 22 is illustrated with reference to FIGS. 22 and 23.

A method of manufacturing the semiconductor device using the test pattern of FIG. 22 is as follows. A substrate 110 including a device region and a test region is prepared. The device region may not be shown along a cutting direction of substrate 110. An interlayer insulating film 120 is formed on the test region of the substrate 110. A photolithography process and an etching process are performed on a first interconnect layer 130 disposed on the interlayer insulating film 120, in order to form multiple first metal interconnects 135 using the mask including the test pattern of FIG. 22 corresponding to the first line patterns X at a first level of the test pattern. A photolithography process and an etching process are performed on a first via layer 140 of the test region in order to form multiple via structures 145 using the mask including the test pattern of FIG. 22 corresponding to the via patterns V at a third level of the test pattern. A photolithography process and an etching process are performed on a second interconnect layer 150 of the test region in order to form multiple second metal interconnects 155 using the mask including the test pattern of FIG. 22 corresponding to the second line patterns Y at a second level of the test pattern. The first interconnect layer 130, the second interconnect layer 150, and the first via layer 140 may each include an insulating film.

Repetitive description associated with the regions and materials of the semiconductor device will be omitted.

In region AA of FIG. 22, the via patterns V are illustrated as being independently formed far away from one another. In addition, the via patterns V share a center with the overlap region OL. This shows a difference with a via pattern V of region CC to be described below. The test pattern is formed to meet the design rule. However, when the test pattern is actually implemented in a semiconductor device, the independent via pattern may induce an open-circuit failure due to limitations in a process, etc. When designed via patterns V are implemented without failures as the via structures 145 in the semiconductor device, a designed space of the via patterns V may actually be implemented in the semiconductor device.

A test method for a semiconductor device may include forming first pads that are electrically connected with the first metal interconnect 135 and each correspond to a first test pad XP connected with a first line pattern X of the test pattern, providing an electric signal to the first pads, and examining failures of the first metal interconnect 135, the second metal interconnect 155, and the via structure 145 using the electric signal.

According to the test method of the semiconductor device according to the present disclosure, failures can be accurately detected in a short time. That is, when an electric signal is provided to first pads, and electric current flows between the first pads, the first metal interconnect 135, the second metal interconnect 155, and the via structure 145 according to an embodiment of the present disclosure may be determined as normal.

On the other hand, when the electric signal is provided to first pads, and electric current does not flow between the first pads, the first metal interconnect 135, the second metal interconnect 155, and the via structure 145 according to an embodiment of the present disclosure may be determined as having an open-circuit failure.

Repetitive description associated with the test method for the semiconductor device will be omitted.

Figure 24:
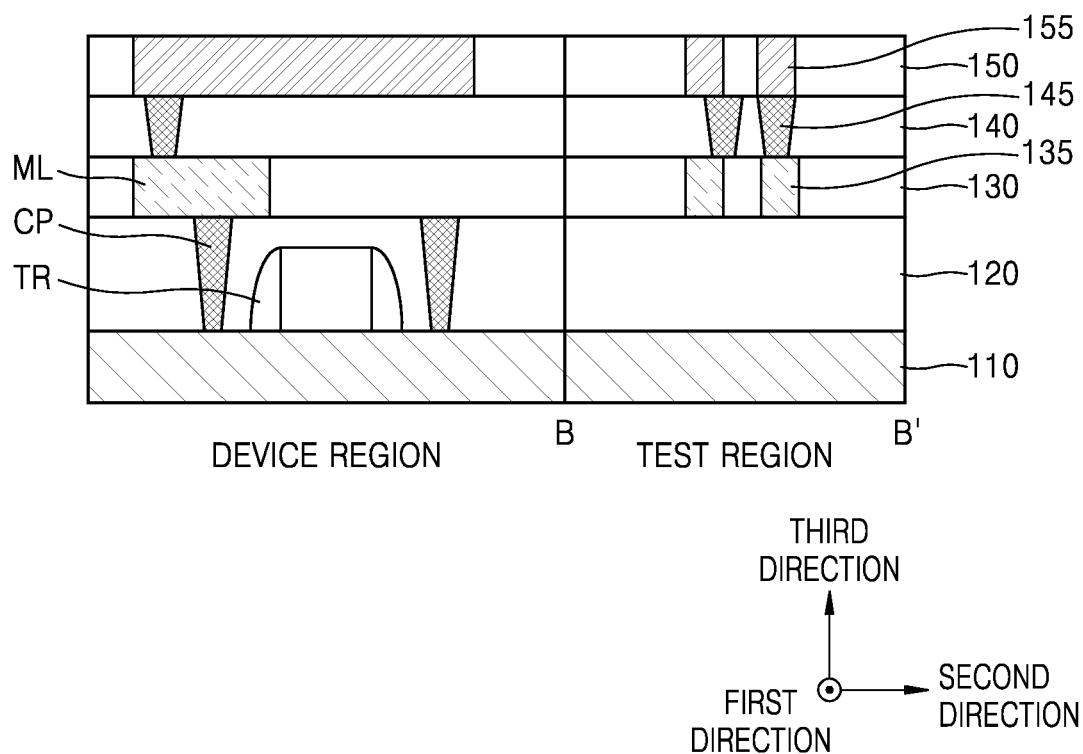
FIG. 24 is a cross sectional view of a semiconductor device that is used in a test method for a semiconductor device according to an embodiment of the present disclosure.

FIG. 24 is a cross sectional view of a semiconductor device that is used in a test method for a semiconductor device according to an embodiment of the present disclosure.

A cross sectional view of the semiconductor device processed with a mask including the test pattern of FIG. 22 taken along line B-B' having, as its center, a part of the semiconductor device corresponding to region BB of FIG. 22 is illustrated with reference to FIGS. 22 and 24.

A method of manufacturing the semiconductor device using the test pattern of FIG. 22 is as follows. A substrate 110 including a device region and a test region is prepared. An interlayer insulating film 120 is formed on the test region of the substrate 110. A photolithography process and an etching process are performed on a first interconnect layer 130 disposed on the interlayer insulating film 120 in order to form multiple first metal interconnects 135 using the mask including the test pattern of FIG. 22 corresponding to the first line patterns X at a first level of the test pattern. A photolithography process and an etching process are performed on a first via layer 140 of the test region in order to form multiple via structures 145 using the mask including the test pattern of FIG. 22 corresponding to the via patterns V at a third level of the test pattern. A photolithography process and an etching process are performed on a second interconnect layer 150 of the test region in order to form multiple second metal interconnects 155 using the mask including the test pattern of FIG. 22 corresponding to the second line patterns Y at a second level of the test pattern. The first interconnect layer 130, the second interconnect layer 150, and the first via layer 140 may each include an insulating film.

Repetitive description associated with the regions and materials of the semiconductor device will be omitted.

In region BB of FIG. 22, the via patterns V are illustrated as being formed adjacent to one another. The test pattern is formed to meet the design rule. However, when the test pattern is actually implemented in a semiconductor device, adjacent via patterns V may induce an open-circuit or short-circuit failure due to limitations in a process. When designed via patterns V are disposed without failures in the semiconductor device, a design space of the via patterns V may actually be implemented in the semiconductor device.

A test method for a semiconductor device may include forming first pads that are electrically connected with the first metal interconnect 135 and each correspond to a first test pad XP connected with a first line pattern X of the test pattern, providing an electric signal to the first pads, and examining failures of the first metal interconnect 135, the second metal interconnect 155, and the via structure 145 using the electric signal.

Repetitive description associated with the test method for the semiconductor device will be omitted.

Figure 25:
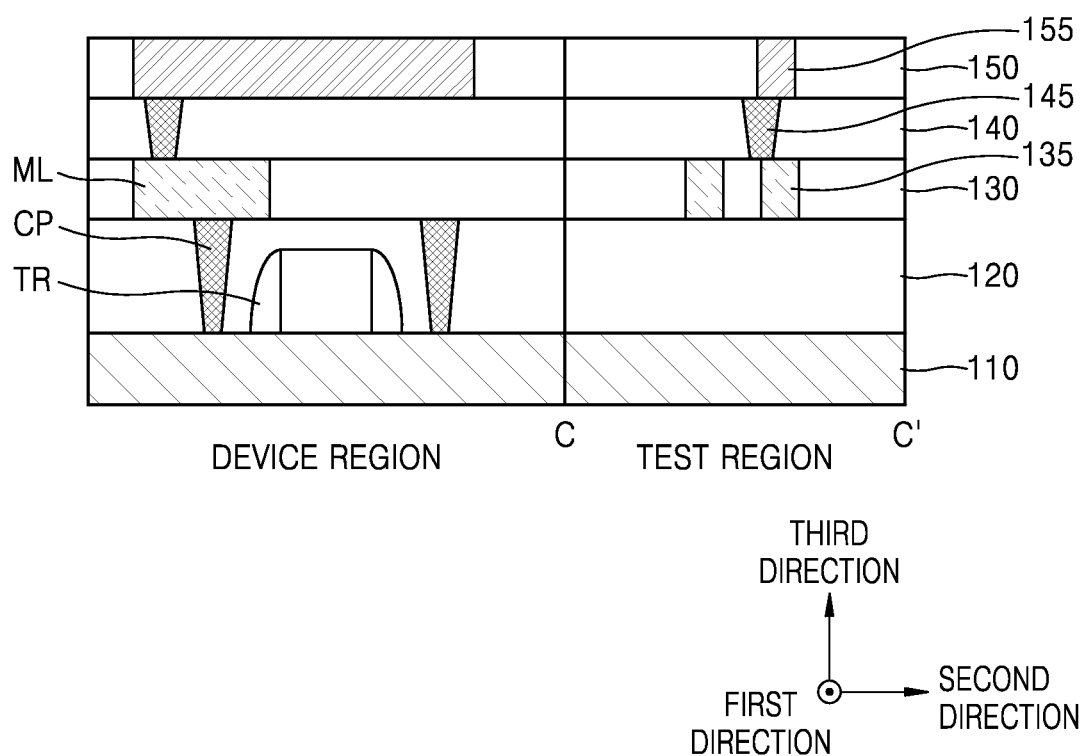
FIG. 25 is a cross sectional view of a semiconductor device that is used in a test method for a semiconductor device according to an embodiment of the present disclosure.

FIG. 25 is a cross sectional view of a semiconductor device that is used in a test method for a semiconductor device according to an embodiment of the present disclosure.

A cross sectional view of the semiconductor device processed with a mask including the test pattern of FIG. 22 taken along line C-C' having, as its center, a part of the semiconductor device corresponding to region CC of FIG. 22 is illustrated with reference to FIGS. 22 and 25.

A method of manufacturing the semiconductor device using the test pattern of FIG. 22 is as follows. A substrate 110 including a device region and a test region is prepared. An interlayer insulating film 120 is formed on the test region of the substrate 110. A photolithography process and an etching process are performed on a first interconnect layer 130 disposed on the interlayer insulating film 120 in order to form multiple first metal interconnects 135 using the mask including the test pattern of FIG. 22 corresponding to the first line patterns X at a first level of the test pattern. A photolithography process and an etching process are performed on a first via layer 140 of the test region in order to form multiple via structures 145 using the mask including the test pattern of FIG. 22 corresponding to the via patterns V at a third level of the test pattern. A photolithography process and an etching process are performed on a second interconnect layer 150 of the test region in order to form multiple second metal interconnects 155 using the mask including the test pattern of FIG. 22 corresponding to the second line patterns Y at a second level of the test pattern. The first interconnect layer 130, the second interconnect layer 150, and the first via layer 140 may each include an insulating film.

Repetitive description associated with the regions and materials of the semiconductor device will be omitted.

In region CC of FIG. 22, the via patterns V are illustrated as being independently formed far away from one another. In addition, the via patterns V are formed to partially overlap the first line pattern X1 and the second line pattern Y2. This shows a difference with the via pattern V of region AA described above. The test pattern is formed to meet the design rule. However, when the test pattern is actually implemented in a semiconductor device, adjacent via patterns V may induce an open-circuit or short-circuit failure due to limitations in a process. When designed via patterns V are disposed without failures in the semiconductor device, a design space of the via patterns V may actually be implemented in the semiconductor device.

A test method for a semiconductor device may include forming first pads that are electrically connected with the first metal interconnect 135 and each correspond to a first test pad XP connected with a first line pattern X of the test pattern, providing an electric signal to the first pads, and examining failures of the first metal interconnect 135, the second metal interconnect 155, and the via structure 145 using the electric signal.

Repetitive description associated with the test method for the semiconductor device will be omitted.

Figure 26:
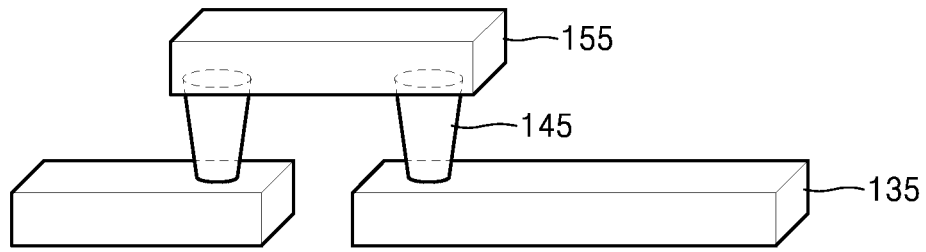
FIG. 26 is a perspective view showing a main part of a semiconductor device that is used in a test method for a semiconductor device according to an embodiment of the present disclosure.

FIG. 26 is a perspective view showing a main part of a test region of a semiconductor device that is used in a test method for a semiconductor device according to an embodiment of the present disclosure.

A perspective view showing a first metal interconnect 135, a via structure 145 formed on the first metal interconnect 135, and a second metal interconnect 155 formed on the via structure 145 is illustrated with reference to FIG. 26.

Ideally, the metal interconnects 135 and 155 and the via structure 145 should be formed as shown in FIG. 26. However, it is actually very difficult to form such an ideal structure due to several design variables and process variables in a real semiconductor device manufacturing process. In particular, in a process of forming the via structure 145, the current trend is to decrease the design rule, causing a decrease in a diameter of the via structure 145 and an increase in a height thereof. To this end, a considerable processing technology is required.

Accordingly, the present disclosure provides a test method for a semiconductor device that may easily detect process failures such as an open-circuit or a short-circuit of the via structure 145, which may occur in an actual semiconductor device manufacturing process, by utilizing a test pattern designed with an algorithm for variably (e.g., arbitrarily, pseudo-randomly) positioning via patterns in multiple line patterns. The algorithm may be stored in a memory and executed using a tangible processor of, e.g., a computer.

Figure 27:
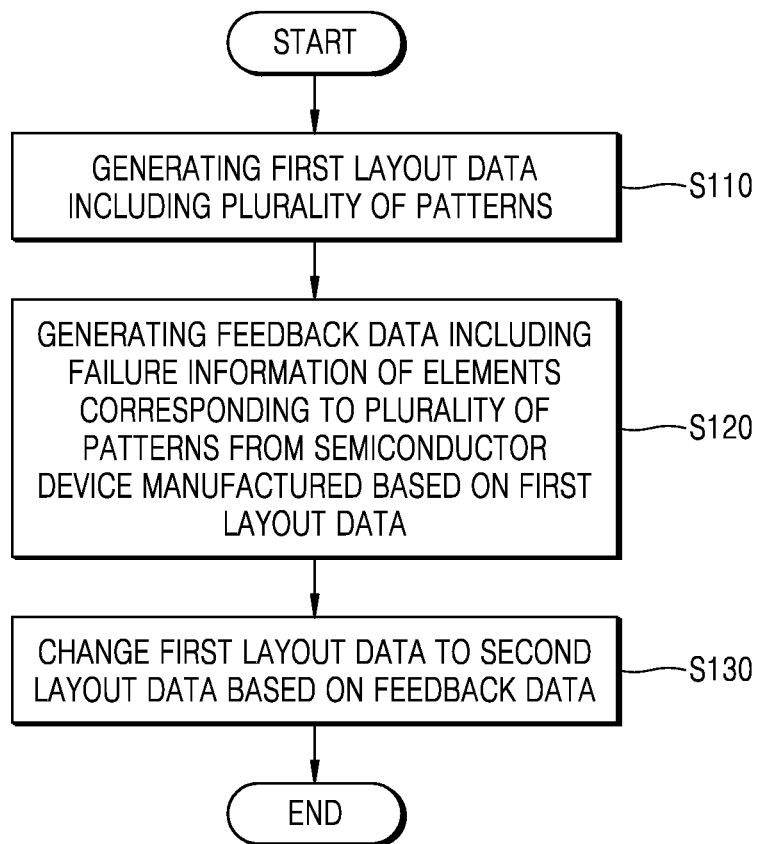
FIG. 27 is a flowchart showing a computer-implemented method for designing an integrated-circuit layout according to an embodiment of the present disclosure.

FIG. 27 is a flowchart showing a computer-implemented method for designing an integrated-circuit layout according to an embodiment of the present disclosure.

Referring to FIG. 27, the computer-implemented method for designing an integrated circuit includes generating first layout data including multiple patterns (S110), generating feedback data including failure information of elements corresponding to the patterns from a semiconductor device manufactured on the basis of the first layout data (S120), and changing the first layout data to a second layout data on the basis of the feedback data (S130).

Referring to FIGS. 12 and 27 together, the patterns according to an embodiment of the present disclosure include the first line patterns, the connection line pattern, the second line patterns, and the via patterns, which have been described above.

The semiconductor device includes the first metal interconnects corresponding to the first line patterns, the metal connection line corresponding to the connection line pattern, the second metal interconnects corresponding to the second line patterns, the via structures corresponding to the via patterns, and the first pads electrically connected with the first metal interconnects and the second pad electrically connected with the metal connection line.

The generating of the feedback data (S120) includes providing an electric signal to a first pad and a second pad to be measured, generating the feedback data as normal data when electric current flows between the first pad and the second pad and does not flow between another first pad to which the electric signal was not provided and the second pad, generating the feedback data as short-circuit failure data when electric current flows between the first pad and the second pad and also flows between another first pad to which the electric signal was not provided and the second pad, and generating the feedback data as open-circuit failure data when electric current does not flow between the first pad and the second pad.

The changing of the first layout data to the second layout data (S130) includes changing the patterns corresponding to the short-circuit failure data and the open-circuit failure data to the patterns corresponding to the normal data.

Referring to FIGS. 22 and 27 together, the patterns according to an embodiment of the present disclosure include the first line patterns, the second line patterns, and the via patterns, which have been described above.

The semiconductor device includes the first metal interconnects corresponding to the first line patterns, the second metal interconnects corresponding to the second line patterns, the via structures corresponding to the via patterns, and the first pads electrically connected with the first metal interconnects at both ends.

The generating of the feedback data includes providing an electric signal to first pads to be measured, generating the feedback data as normal data when electric current flows between the first pads, and generating the feedback data as open-circuit failure data when electric current does not flow between the first pads.

The changing of the first layout data to the second layout data (S130) includes changing the patterns corresponding to the open-circuit failure data to the patterns corresponding to the normal data.

The above-described subject matter of the present disclosure is to be considered illustrative and not restrictive, and it should be understood that numerous other modifications and embodiments can be devised by those skilled in the art that will fall within the spirit and scope of the principles of the present disclosure.

Accordingly, the embodiments of the present disclosure are to be considered descriptive and not restrictive of the present disclosure, and do not limit the scope of the present disclosure. The scope of the present disclosure should be determined by the following claims and their appropriate legal equivalents.

What is claimed is:

1. A test method for a semiconductor device, the test method comprising:
   preparing a substrate including a device region and a test region;
   forming a plurality of first metal interconnects with a first width in a first interconnect layer of the test region, the plurality of first metal interconnects extending in a first direction and having discontinuous regions spaced apart by a first space;
   forming a metal connection line in a second interconnect layer of the test region, the metal connection line extending in the first direction;
   forming a plurality of second metal interconnects with a second width in the second interconnect layer of the test region, the plurality of second metal interconnects extending in a second direction perpendicular to the first direction and branching from the metal connection line;
   forming a plurality of via structures with a third width in a first via layer of the test region around an intersection region having the first width of the first metal interconnect and the second width of the second metal interconnect, the plurality of via structures extending in a third direction perpendicular to the first direction and the second direction;
   forming first pads electrically connected with the plurality of first metal interconnects and a second pad electrically connected with the metal connection line;
   providing an electric signal to the second pad and one of the first pads; and
   examining failures of the plurality of first metal interconnects, the plurality of second metal interconnects, and the plurality of via structures using the electric signal.

2. The test method of claim 1, wherein, in the forming of the plurality of first metal interconnects, the discontinuous regions are formed at the same position or at different positions in the second direction at the same first space or at different first spaces.

3. The test method of claim 1, Wherein, in the forming of the plurality of second metal interconnects, the plurality of second metal interconnects are formed to extend to the same length or to different lengths in the second direction.

4. The test method of claim 1, wherein, in the forming of the plurality of second metal interconnects, each of the plurality of first metal interconnects has an intersection region with at least one second line pattern selected among the plurality of second metal interconnects.

5. The test method of claim 4, wherein the intersection region comprises:
   a first intersection region having a portion of the first width of the first metal pattern and a portion of the second width of the second metal pattern; and
   a second intersection region having an entirety of the first width of the first metal pattern and an entirety of the second width of the second metal pattern.

6. The test method of claim 1, wherein, in the forming of the metal connection line, the metal connection line includes a first metal connection line and a second metal connection line facing each other with the plurality of first metal interconnects interposed therebetween.

7. The test method of claim 6, wherein,
   odd-numbered interconnects among the plurality of first metal interconnects form a first group,
   even-numbered interconnects among the plurality of first metal interconnects form a second group, odd-numbered interconnects among the plurality of second metal interconnects branch from the first metal connection line, and even-numbered interconnects among the plurality of second metal interconnects branch from the second metal connection line.

8. The test method of claim 7, wherein, in the forming of the plurality of via structures, the plurality of via structures are formed around a first intersection region having the first width of the first metal interconnects of the first group and the second width of the second metal interconnects branching from the first metal connection line and around a second intersection region having the first width of the first metal interconnects of the second group and the second width of the second metal interconnects branching from the second metal connection line.

9. The test method of claim 8, wherein, in the forming of the plurality of via patterns, each of the plurality of via structures are formed to have a center that is vertically matched to or horizontally separated from a center of the first intersection region or a center of the second intersection region in order to at least partially overlap the first intersection region or the second intersection region.

10. The test method of claim 1, wherein,
the first via layer is formed on the first interconnect layer, and
the second interconnect layer is termed on the first via layer.

11. A computer-implemented method for designing an integrated-circuit layout including a plurality of patterns, the computer-implemented method comprising:
generating first layout data including the plurality of patterns;
generating feedback data including failure information of elements corresponding to the plurality of patterns from a semiconductor device manufactured based on the first layout data; and
changing the first layout data to second layout data based on the feedback data,
wherein the plurality of patterns comprise:
a plurality of first line patterns disposed at a first level, having discontinuous regions spaced apart by a first space, having a first width, and extending in a first direction;
a connection line pattern disposed at a second level and extending in the first direction;
a plurality of second line patterns disposed at the second level, branching from the connection line pattern, having a second width, and extending in a second direction perpendicular to the first direction; and
a plurality of via patterns disposed at a third level, having a third width, and formed around an intersection region having the first width of the first line pattern and the second width of the second line pattern.

12. The computer implemented method of claim 11, wherein the semiconductor device comprises:
a substrate including a device region and a test region;
a plurality of first metal interconnects corresponding to the plurality of first line patterns in a first interconnect layer of the test region;
a metal connection line corresponding to the connection line pattern in a second interconnect layer of the test region;
a plurality of second metal interconnects corresponding to the plurality of second line patterns in the second interconnect layer of the test region;
a plurality of via structures corresponding to the plurality of via patterns in a first via layer of the test region; and
first pads electrically connected with the plurality of first metal interconnects and a second pad electrically connected with the metal connection line.

13. The computer-implemented method of claim 12, wherein the generating of the feedback data comprises:
providing an electric signal to a first pad and a second pad to be measured;
generating the feedback data as normal data when electric current flows between the first pad and the second pad and does not flow between another first pad to which the electric signal was not provided and the second pad;
generating the feedback data as short-circuit failure data when electric current flows between the first pad and the second pad and also flows between another first pad to which the electric signal was not provided and the second pad; and
generating the feedback data as open-circuit failure data when electric current does not flow between the first pad and the second pad.

14. The computer-implemented method of claim 13, wherein the changing of the first layout data to the second layout data comprises changing the plurality of patterns corresponding to the short-circuit failure data and the open-circuit failure data to the plurality of patterns corresponding to the normal data.

15. The computer-implemented method of claim 11, wherein the first width, the second width, and the third width have variable values.

* * * * *